(12) United States Patent
Kuisma

(10) Patent No.: US 11,280,610 B2
(45) Date of Patent: *Mar. 22, 2022

(54) PIEZOELECTRIC Z-AXIS GYROSCOPE

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 245 days.

This patent is subject to a terminal disclaimer.

(21) Appl. No.: 16/577,095

(22) Filed: Sep. 20, 2019

(65) Prior Publication Data
US 2020/0109945 A1   Apr. 9, 2020

(30) Foreign Application Priority Data

Oct. 3, 2018   (FI) .................................... 20185827

(51) Int. Cl.
*G01C 19/5733*   (2012.01)
*B81B 3/00*   (2006.01)
(Continued)

(52) U.S. Cl.
CPC ........ *G01C 19/5733* (2013.01); *B81B 3/0018* (2013.01); *G01C 19/5684* (2013.01);
(Continued)

(58) Field of Classification Search
CPC ............ G01C 19/5733; G01C 19/5698; G01C 19/5656; G01C 19/5607; G01C 19/5747;
(Continued)

(56) References Cited

U.S. PATENT DOCUMENTS

2009/0056443 A1* 3/2009 Netzer ............... G01C 19/5719
73/504.12
2010/0263446 A1 10/2010 Tamura et al.
(Continued)

FOREIGN PATENT DOCUMENTS

JP          2011158319 A    8/2011
WO    WO 2009/078284 A1    6/2009
(Continued)

OTHER PUBLICATIONS

Feb. 17, 2020 Search Report issued in European Patent Application No. 19198500.
(Continued)

*Primary Examiner* — Helen C Kwok
(74) *Attorney, Agent, or Firm* — Squire Patton Boggs (US) LLP

(57) ABSTRACT

The disclosure describes a z-axis gyroscope where a proof mass is suspended from a peripheral suspender and a central suspender. The peripheral suspender forms a truncated triangle around the proof mass, and the central suspender extends through the truncated corner of the triangle formed by the peripheral suspender. The proof mass is driven into a primary oscillation mode by one or more piezoelectric drive transducers located on the peripheral suspender. One or more piezoelectric sense transducers located on the base of the peripheral suspender are configured to detect the secondary oscillation mode of the proof mass.

6 Claims, 15 Drawing Sheets

(51) Int. Cl.
*G01C 19/5684* (2012.01)
*G01C 19/5698* (2012.01)
*G01C 19/574* (2012.01)
*G01C 19/5712* (2012.01)

(52) U.S. Cl.
CPC ....... *G01C 19/5698* (2013.01); *G01C 19/574* (2013.01); *G01C 19/5712* (2013.01); *B81B 2201/0242* (2013.01)

(58) Field of Classification Search
CPC .............. G01C 19/5712; G01C 19/574; G01C 19/5642; G01C 19/5677; G10C 19/5684
See application file for complete search history.

(56) References Cited

U.S. PATENT DOCUMENTS

| | | | |
|---|---|---|---|
| 2011/0030473 A1* | 2/2011 | Acar | G01P 15/125 73/504.12 |
| 2011/0094301 A1* | 4/2011 | Rocchi | G01C 19/574 73/504.08 |
| 2012/0048017 A1* | 3/2012 | Kempe | G01C 19/5747 73/504.12 |
| 2015/0162522 A1 | 6/2015 | Ogura et al. | |
| 2015/0211854 A1 | 7/2015 | Ruohio et al. | |
| 2015/0214462 A1 | 7/2015 | Zolfagharkhani et al. | |
| 2015/0247726 A1* | 9/2015 | Watanabe | G01C 19/5656 73/504.12 |
| 2015/0285634 A1* | 10/2015 | Watanabe | G01C 19/5733 73/504.12 |
| 2016/0187135 A1* | 6/2016 | Yasumoto | G01C 19/5607 73/504.16 |
| 2016/0245667 A1 | 8/2016 | Najafi et al. | |
| 2016/0273917 A1 | 9/2016 | Kobayashi | |
| 2016/0341551 A1* | 11/2016 | Cook | G01C 19/5726 |
| 2019/0346265 A1* | 11/2019 | Kuisma | G01C 19/574 |
| 2020/0200534 A1* | 6/2020 | Kuisma | G01C 19/5684 |
| 2020/0200535 A1* | 6/2020 | Kuisma | G01C 19/574 |
| 2020/0263990 A1* | 8/2020 | Kuisma | G01C 19/5712 |

FOREIGN PATENT DOCUMENTS

| | | |
|---|---|---|
| WO | 2013108804 A1 | 7/2013 |
| WO | WO 2014/091976 A1 | 6/2014 |

OTHER PUBLICATIONS

Finnish Search Report dated Apr. 18, 2019 corresponding to Finnish Patent Application No. 20185827.

* cited by examiner

PIEZOELECTRIC Z-AXIS GYROSCOPE

FIELD OF THE DISCLOSURE

This disclosure relates to microelectromechanical (MEMS) gyroscopes, and more particularly to piezoelectrically driven and sensed z-axis gyroscopes, where proof masses move in the device plane in both their primary mode and their secondary mode. The present disclosure further concerns arrangements for reducing coupling between the primary and secondary modes by suitable placement and interconnection of piezoelectric drive and sense transducers around the periphery of the proof masses.

BACKGROUND OF THE DISCLOSURE

MEMS gyroscopes typically include proof masses which are driven into either linear or rotational oscillating motion, or a combination of these two motions. In z-axis MEMS gyroscopes, the primary oscillation induced by drive transducers is configured to occur in the substrate plane. If the gyroscope undergoes angular rotation about the z-axis, which is perpendicular to the substrate plane, the resulting secondary oscillation induced by the Coriolis force also will also occur in the substrate plane.

The partly mobile proof masses, which constitute the rotation-sensitive elements of the gyroscope, may be suspended from a fixed structure by suspenders which are configured to flexibly allow oscillating drive motion and sense motion at a desired resonant frequency. The net reaction force and torque of the drive oscillation mode and sense oscillation mode should preferably be zero, so that kinetic energy does not leak from these desired oscillation modes and external vibrations do not couple to them.

It is known that a gyroscope where a pair of interconnected proof masses are synchronized to continuously oscillate in opposite directions is less vulnerable to disturbances caused by external vibrations than gyroscopes with only one oscillating proof mass. This is because the effect of the disturbance can be automatically cancelled by reading the measurement signal in a differential manner. It is also known that further robustness can be achieved with an additional pair of proof masses which oscillates orthogonally to the first.

However, a general problem in z-axis gyroscopes with coupled proof mass pairs is that the primary oscillation may be coupled into the secondary oscillation or the secondary signal, so that each oscillation cycle in the primary mode also generates simultaneous oscillation in the secondary mode or a signal in the transducers that are disposed to detect the secondary oscillation. Asymmetries in any part of a MEMS gyroscope can give rise to coupling effects, and some degree of asymmetry is unavoidable since manufacturing tolerances can never be reduced to zero. The suspension arrangements from which proof mass pairs are suspended should therefore preferably be designed to flexibly allow both the primary and the secondary oscillation mode, but to resist coupling between these two modes.

Document US2016341551 discloses a MEMS gyroscope with multiple pairs of proof masses in oscillation around a crossing point. A problem with the suspension arrangement disclosed in this document is that it does not prevent coupling between the primary and the secondary mode.

BRIEF DESCRIPTION OF THE DISCLOSURE

An object of the present disclosure is to provide an apparatus for to alleviate the above disadvantages.

The object of the disclosure is achieved by an arrangement which is characterized by what is stated in the independent claim. The preferred embodiments of the disclosure are disclosed in the dependent claims.

The disclosure is based on the idea of forming a gyroscope with piezoelectric drive and sense transducers placed on a suspender with the shape of a truncated triangle which partly surrounds an oscillating proof mass.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
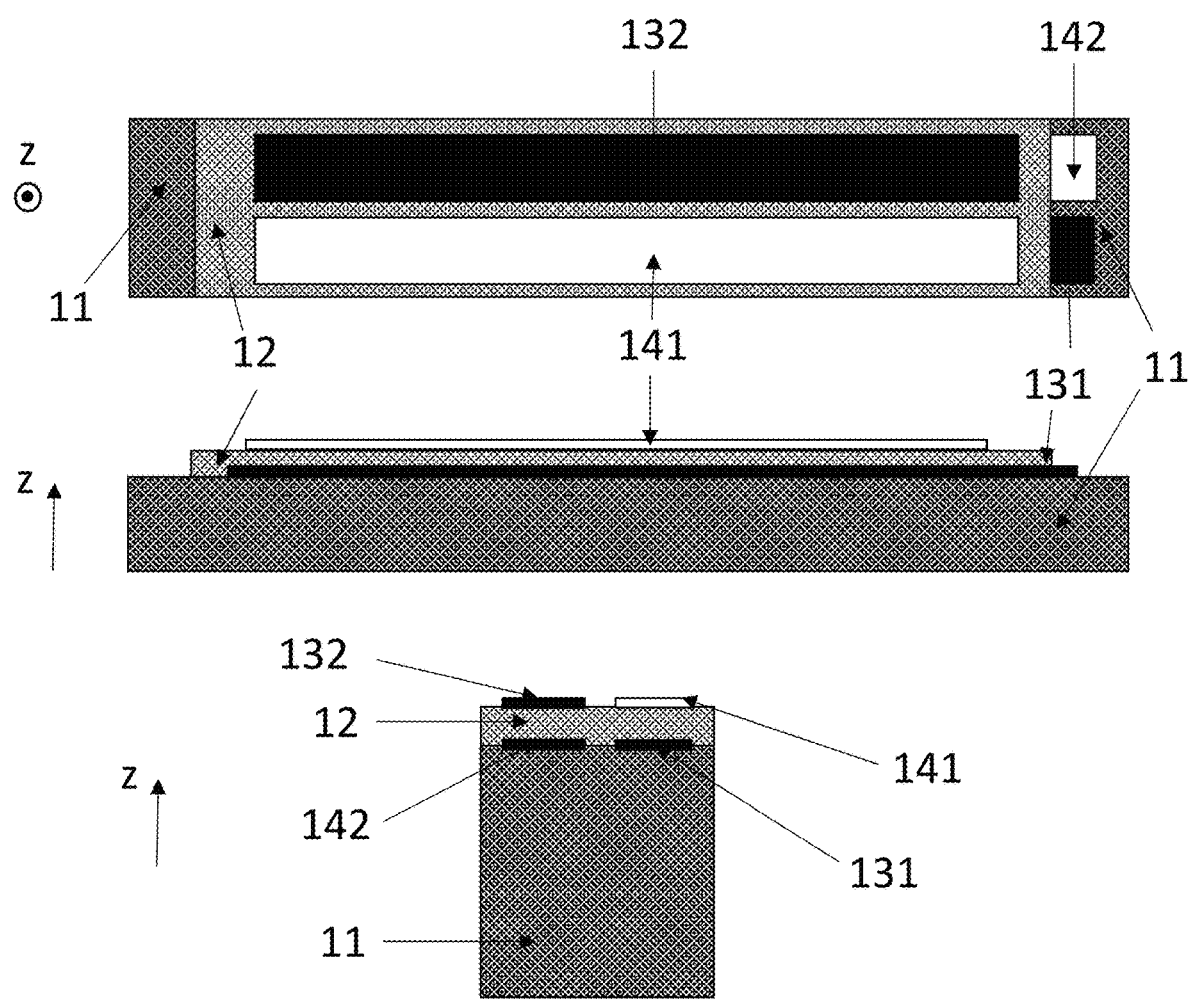
FIG. 1 illustrates three cross-sections of a bending piezoelectric transducer placed on a suspender.

FIG. 1 illustrates three cross-sections of a bending piezoelectric transducer placed on a suspender. The transducer can generate or measure bending motion in the xy-plane, which is also referred to as the device plane in this disclosure. Movement in the device-plane may be referred to as in-plane movement while movement out of the device plane may be referred to as out-of-plane movement. The z-axis, which is perpendicular to the device plane, may be referred to as the vertical direction.

The suspender may be a silicon beam with a sufficiently large width/length aspect ratio to be bent by the piezoelectric stress or strain produced by the transducer or by the secondary oscillation mode of the proof mass.

A pair of first electrode layers 141 and 142 have been placed on the suspender 11, one on the upper side of a layer of piezoelectric material 12 and one on the lower side (up and down refers in this case to the direction of the z-axis). These electrodes are paired with second electrode layers 131 and 132, respectively, as illustrated in the figure. Layers 141, 12 and 131 together form a first piezoelectric transducer, and layers 142, 12 and 132 together form a second piezoelectric transducer.

If drive voltages with opposite polarity are applied to these two transducers, the two transducers produce opposite strains in the xy-plane, which can bend the suspender 11. If the transducers are used as sense transducers, in-plane bending will generate a charge or voltage differential between the two transducers.

The drawing conventions of FIG. 1 will be employed throughout this disclosure to illustrate piezoelectric transducers. In other words, two parallel rectangles of opposite colour will be used to indicate a piezoelectric transducer. For simplicity, these two parallel rectangles will primarily be referred to in the singular, as a single transducer, even though the structure is actually a construction which comprises two transducers. Similarly, the drive and sense signals pertaining to one transducer will be referred to in the singular, as a single drive/sense signal, even though they actually comprise two voltages.

Black and white colours indicate transducer polarity. The polarity of a transducer with a white rectangle on the right-hand side is opposite to the polarity of a transducer (seen in the same figure) with a black rectangle on the on the right-hand side.

The piezoelectric layer 12, which may be an aluminium nitride (AlN), doped aluminium nitride (e.g. ScAlN) or PZT-ceramic layer, is typically not thicker than a few micrometers. The thickness of the silicon suspender 11 may, for example, be between 4-100 μm, preferably between 10-50 μm.

When piezoelectric transducers described in this disclosure are used in the sense mode, the largest output voltage between the electrodes of the transducer may be achieved when the transducer capacitance equals the sum of the capacitance of the external connections and the input capacitance of the amplifier. The capacitance of the transducer is determined by its area and by the thickness of the piezoelectric layer.

This disclosure describes a microelectromechanical z-axis gyroscope which comprises a first proof mass aligned on a first axis in its rest position.

The first proof mass is suspended from a first peripheral suspender and a first central suspender. The first peripheral suspender extends from a first anchor point to a second anchor point, and the first peripheral suspender has the shape of an isosceles triangle which partially surrounds the first proof mass, wherein the isosceles triangle is truncated at the first and second anchor points, and a first leg of the first peripheral suspender extends from the first anchor point past a first side of the first proof mass to a first corner point on the first peripheral suspender. A second leg of the first peripheral suspender extends from the second anchor point past a second side of the first proof mass to a second corner point on the first peripheral suspender, and the base of the first peripheral suspender, which joins together the first leg and the second leg, extends from the first corner point to the second corner point past a third side of the first proof mass, and the base of the first peripheral suspender is attached to the third side of the first proof mass with a connector aligned on the first axis.

The first central suspender extends through the truncated corner of the isosceles triangle formed by the peripheral suspender, and is attached to the first proof mass.

The first proof mass is driven into a primary oscillation mode by one or more piezoelectric drive transducers located on the first and/or second legs of the first peripheral suspender, which simultaneously bend the first and second legs of the first peripheral suspender in the same in-plane direction.

One or more piezoelectric sense transducers located on the base of the first peripheral suspender are configured to detect the secondary oscillation mode of the first proof mass, which bends the middle of the base in a direction substantially parallel to the first axis when the gyroscope undergoes angular rotation, whereby the sense oscillation is converted into a sense signal by the one or more sense transducers.

The first and the second anchor points lie near the apex of the truncated isosceles triangle formed by the peripheral suspender. The first proof mass is attached to the first central suspender near the apex of the truncated isosceles triangle formed by the peripheral suspender.

If the gyroscope comprises only one proof mass, then the crossing point does not correspond to the center of gravity of that proof mass in the xy-plane. However, in the embodiments described below, where the gyroscope comprises a proof mass system with multiple proof masses, the crossing point may correspond to the center of gravity of the proof mass system in the xy-plane.

In this disclosure, a part of the gyroscope is considered to be "aligned" on an axis if the center of gravity of that part lies on that axis.

In this disclosure, a "fixed" object means an object which is much larger than the MEMS gyroscope structure, or alternatively an object which is securely attached to a larger structure, so that it cannot be moved in relation to the larger structure by the reaction forces generated by the oscillating inertial mass. The term "anchor point" is used to refer to a region of a fixed object where partly mobile objects such as suspenders may be attached to the fixed object. A suspender may be fixed to the anchor point at one end and attached to a partly mobile proof mass at another end, or both of its ends may be fixed to anchor points and its middle may be attached to a partly mobile proof mass.

In the silicon-based MEMS applications described in this disclosure, a "suspended" object means an object which is attached to a fixed base with silicon beams. At least some of these beams are flexible, so that they allow the object to undergo rotational and/or translational oscillation. Elongated silicon beams can be made flexible enough to be bent or twisted by the movement of a proof mass if they are suitably dimensioned in relation to the size of the proof mass. Such flexible beams may also be called suspension springs. In piezoelectric gyroscopes, suspension springs should be sufficiently flexible to be bent by the movement of the proof mass to which they are attached and/or by the piezoelectric transducers placed on top of them.

In this disclosure, the term "suspender" will be used as a short term for suspension springs which attach a proof mass either to a fixed base and/or to other proof masses, for example via a synchronization structure. This term covers beams which have been dimensioned for flexibility, but also beams whose dimensions prevent them from exhibiting significant flexibility in any direction. In other words, some suspenders may be flexible, others not. Each suspender which has a piezoelectric transducer on top is flexible.

In this disclosure, the peripheral suspender has the shape of an isosceles triangle which is truncated at the anchor points. This is illustrated for example in FIG. 2a, where the peripheral suspender 21 extends from the first anchor point 221 to the second anchor point 222, almost all the way around the proof mass 230. Based on the terminology of isosceles triangles, the sides 211 and 212 of the peripheral suspender may be called its legs, and the side 213 may be called its base. Truncation at the anchor points means that, if the legs were to continue past the anchor points, they would meet at the apex of the isosceles triangle. But the legs 211 and 212 must end at the anchor points to allow the proof mass 230 to be suspended also from the third anchor point 223 which supports a part of its weight. In other words, the specification that the first and second anchor points 221 and 222 lie "near" the apex of the isosceles triangle mean that these anchor points are as close as design considerations allow to the central suspender 262, which joins the proof mass 230 to the anchor point 223. In some embodiments with multiple proof masses, a synchronization element placed around the crossing point may require additional anchor points, and it may then be necessary to clear space for them by moving the first and second anchor points 221 and 222 of the peripheral suspender 21 further away from the apex. But if no such restrictions exist, the first and second anchor points 221 and 222 may be placed adjacent to the central suspender 262, so that the length of the first and second legs 211 and 212 is maximized.

Figure 2A:
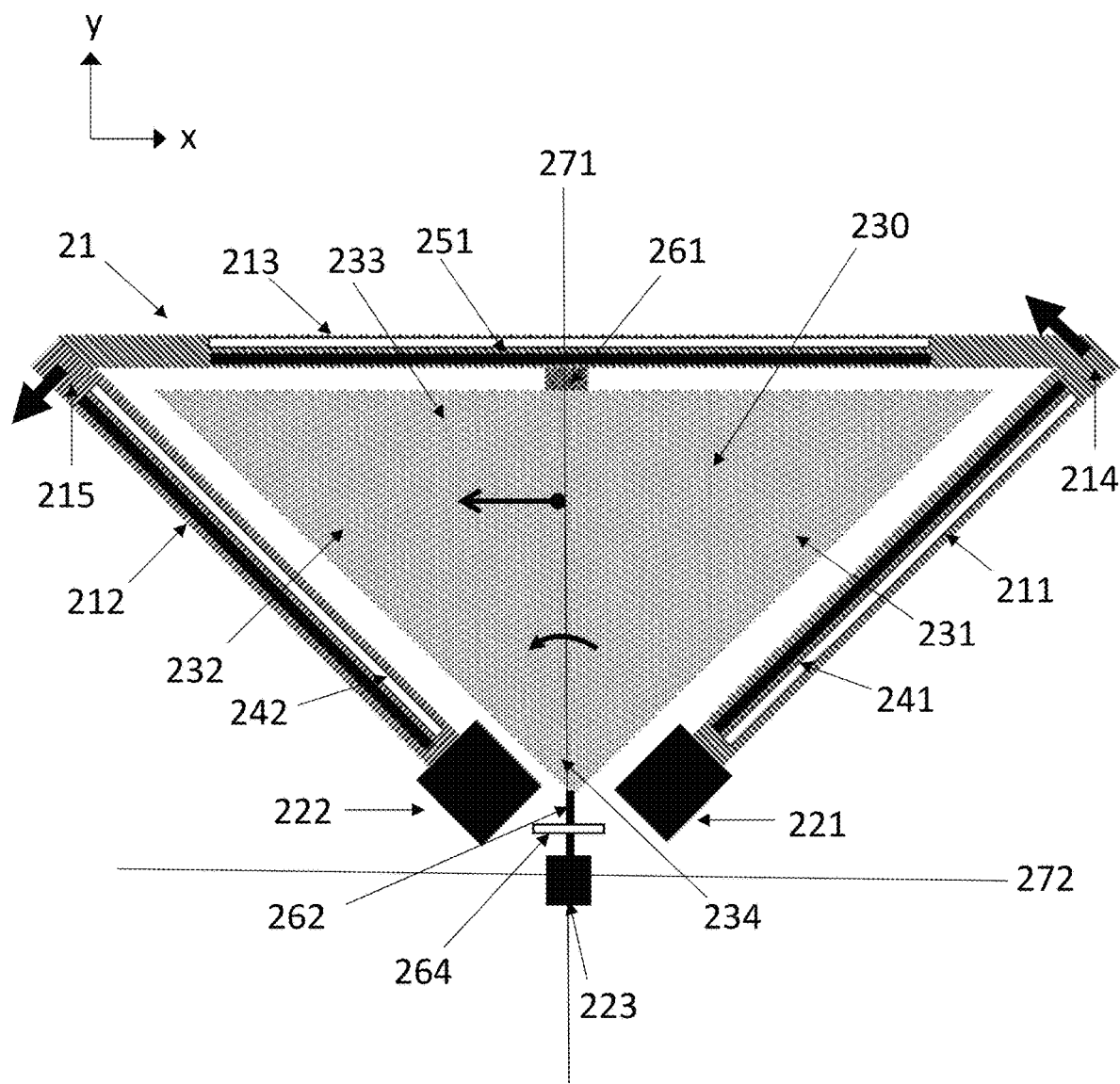
FIGS. 2a-2c illustrates a gyroscope with one proof mass suspended from a peripheral suspender.

The isosceles triangle formed by the peripheral suspender may be a right-angled isosceles triangle, as illustrated in FIG. 2a. However, it can also be an isosceles triangle where the apex angle is larger than 90°, or an isosceles triangle where the apex angle is smaller than 90°. This applies to all embodiments described in this disclosure. An apex angle larger than 90° means that the base/leg length ratio increases compared to 2a, while an apex angle smaller than 90° means that the same ratio decreases. The length ratio between sense transducers and drive transducers can then also be increased/decreased by the same amount. The displacement that a drive transducer can produce is proportional to its length, and the magnitude of the electric signal produced by a sense transducer in response to a given amount of displacement is proportional to its length.

Additional consideration must be given to device geometry if the gyroscope comprises a proof mass system with four proof masses. One way to ensure that the area of the gyroscope is used efficiently is to give the peripheral suspenders the shape of right-angled isosceles triangles. This allows a tight fit between the four peripheral suspenders. This alternative will be illustrated in more detail below, but any other isosceles triangle may also be used in proof mass systems with four masses.

The proof mass may have the shape of a truncated isosceles right-angled triangle with a hypotenuse parallel to the base of the corresponding peripheral suspender, and triangle legs parallel to the triangle legs of the corresponding peripheral suspender. In other words, the proof mass may be shaped like a right-angled isosceles triangle which fits inside the peripheral suspender, as illustrated in FIG. 2a.

However, the proof mass may also have any other shape which fits inside the peripheral suspender. This applies to all embodiments of this disclosure. Again, if the gyroscope comprises a proof mass system with four proof masses, the most efficient area usage may be obtained with proof masses shaped as right-angled isosceles triangles which just fit inside the peripheral suspenders.

The direction of simultaneous bending of the first leg 211 and the second leg 212 of the first peripheral suspender 21 in the same in-plane direction is illustrated with thick black arrows located at the first and second corner points 214 and 215 in FIG. 2a. In the illustrated phase of oscillation, the drive transducers 241 and 242 start to bend the first and second legs 211 and 212 so that the corner points 214 and 215 both move in the device plane in a counter-clockwise direction in relation to the vertical axes which pass through their respective anchor points 221 and 222. This bending motion shifts and rotates the proof mass 230 in a counter-clockwise direction in relation to a vertical axis through the crossing point, where anchor point 223 is located. In the opposite oscillation phase, the corner points and the proof mass both simultaneously move clockwise in relation to the same axes. In other words, the expression "in the same in-plane direction" refers to the fact that the first and second leg always bend simultaneously in the same direction. Nevertheless, the primary oscillation preferably comprises alternating clockwise bending and counter-clockwise bending, so that the legs bend in opposite directions in opposite phases of the oscillation cycle.

First Embodiment

FIG. 2a illustrates a first embodiment where the gyroscope comprises only one proof mass 230. This proof mass is suspended from a peripheral suspender 21 and from a central suspender 262 and aligned on the first axis 271. The first axis 271 crosses the second axis 272 at the crossing point. In this embodiment, a third anchor point 223 is located at the crossing point.

The first leg 211 of the first peripheral suspender 21 extends from the first anchor point 221 past a first side 231 of the first proof mass 230 to a first corner point 214 on the first peripheral suspender 21. A second leg 212 of the first peripheral suspender 21 extends from the second anchor point 222 past a second side 232 of the first proof mass 230 to a second corner point 215 on the first peripheral suspender 21. The first and second sides of the proof mass 231 and 232 lie on opposite sides of the first axis 271.

A first piezoelectric drive transducer 241 is located on the first leg 211 of the peripheral suspender 21. An optional second piezoelectric drive transducer 242 is located on the second leg 211. A gyroscope control circuit may be configured to apply drive voltages to the drive transducers.

When suitable actuation voltages are applied to these drive transducers, the simultaneous bending of the first and second legs 211 and 212 in the same direction drives the first proof mass is driven into primary oscillation. This oscillation is substantially parallel to the second axis. In this context, "substantially parallel" refers, firstly, to the fact that simultaneous counter-clockwise bending (in relation to the crossing point) of the first and second legs 211 and 212 will primarily shift the proof mass 230 to the left, while simultaneous clockwise bending of the first and second legs 211 and 212 will primarily shift the proof mass to the right. But secondly, since they are oriented in different directions, simultaneous bending of the proof mass will also produce a small rotation in the proof mass, counter-clockwise in relation to the crossing point when the legs bend counter-clockwise, and clockwise when the legs bend clockwise (in relation to the crossing point). This combination of linear translation and angular rotation is illustrated with two arrows on the proof mass 230. In other words, the oscillation of the proof mass 230 may be called "substantially parallel" to the second axis because its oscillation is a combination of these two motions, where the linear translation predominates.

The base 213 of the first peripheral suspender 21 joins together the first leg 211 and the second leg 212. The base 213 extends from the first corner point 214 to the second corner point 214 past a third side 233 of the first proof mass 230. The base 213 of the first peripheral suspender 21 is attached to the third side 233 of the first proof mass 230 with a connector 261 aligned on the first axis 271.

The proof mass 230 is attached to the central suspender 262 near the apex of the isosceles triangle formed by the peripheral suspender. The proof mass 230 is suspended from the third anchor point 223 by the central suspender 262. The central suspender 262 may comprise a spring structure 264 which provides flexibility in the direction of the first axis 271, so that the proof mass 230 can move in the secondary oscillation mode without significant counter-force. The central suspender 262 is sufficiently thick in the vertical z-direction, perpendicular to the device-plane, to rigidly resist movement out of the xy-plane. The central suspender 262 is sufficiently thin in the direction of the second axis to allow the proof mass to rotate clockwise and counter-clockwise in relation to the crossing point in drive oscillation without significant counter-torque, and also short enough to prevent significant linear movement of the apex of the proof mass.

A piezoelectric sense transducer 251 on the base 213 of the first peripheral suspender 21 is configured to produce a sense voltage signal from secondary oscillation, which occurs substantially parallel to the first axis 271 when the gyroscope undergoes angular rotation. The gyroscope control unit may be configured to read this sense voltage signal from the sense transducer, and to calculate the rate of angular rotation from this signal.

The momentary direction of secondary oscillation is always orthogonal to the momentary direction of primary oscillation. Therefore, as in drive oscillation, the expression "substantially parallel" sense oscillation refers to the fact that the Coriolis force will primarily move the proof mass 230 back and forth along the first axis 271, even though a small deviation may be present due to manufacturing induced asymmetry.

Figure 2B:
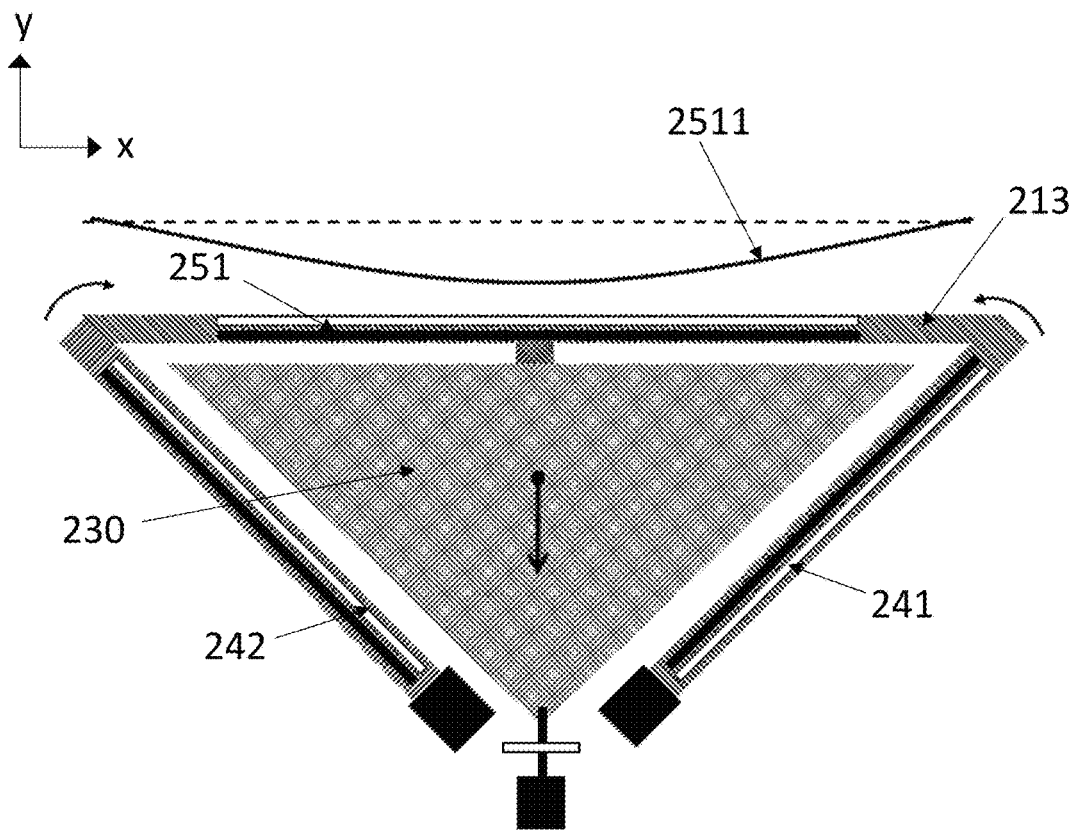

FIG. 2b illustrates the secondary oscillation mode. As the proof mass moves back and forth along the first axis, the base 213, on which the piezoelectric sense transducer 251 is located, bends in the middle. This bending has a small amplitude, but the shape assumed by the piezoelectric sense transducer at one end of the oscillation cycle is illustrated by the curve 2511 in FIG. 2b. The base 213 bends at the middle. The spring 264 in the central suspender 262 should be more flexible in the direction of the first axis than the base 213, so that the central suspender 262 doesn't inhibit the bending of the sense transducer 251.

Figure 2C:
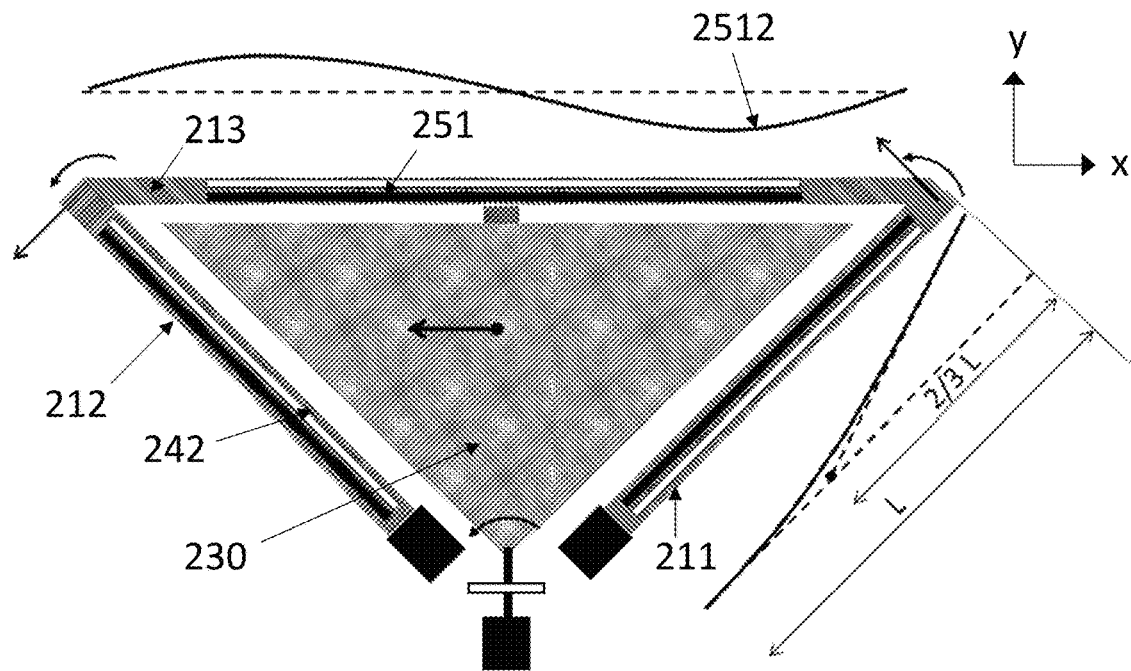

However, the primary oscillation may also bend the base of the peripheral suspender 213 to some extent, as illustrated in FIG. 2c. This is because the angular displacements (in relation to the crossing point) which the bending legs 211 and 212 produce at their tips at the first corner point 214 and second corner point 215 is larger than the angular displacement of the proof mass 230.

The angular displacements of the tips of the bending legs 211 and 212 correspond to an effective radius of rotation that is ⅔ of the length of the leg. Since the legs and the base 213 are stiffly connected at the first and second corner points, the mismatch between the angular displacement of the proof mass and the angular displacement of the tips of the bending legs may be accommodated by the peripheral suspender through reduced bending in the legs 211/212 and/or by S-shaped bending in the base 213. This S-shaped bending is illustrated by the curve 2512 in FIG. 2c. It will cause zero net charge in the piezoelectric sense transducer 251 if the transducer is located perfectly symmetrically in relation to the first axis. But if this symmetry is imperfect (for example due to manufacturing errors), the motion induced by drive oscillation will be coupled into the sense signal which is read from the sense transducer, which is not desirable.

It can be shown that the deformation of the base 213 of the peripheral suspender due to primary oscillation could be avoided if the length of the legs 211 and 212 in FIG. 2c could be 1.06 times (=0.5*1.5*√2) the length of the base 213. However, this is not possible in a triangular geometry.

Second Embodiment

Figure 3:
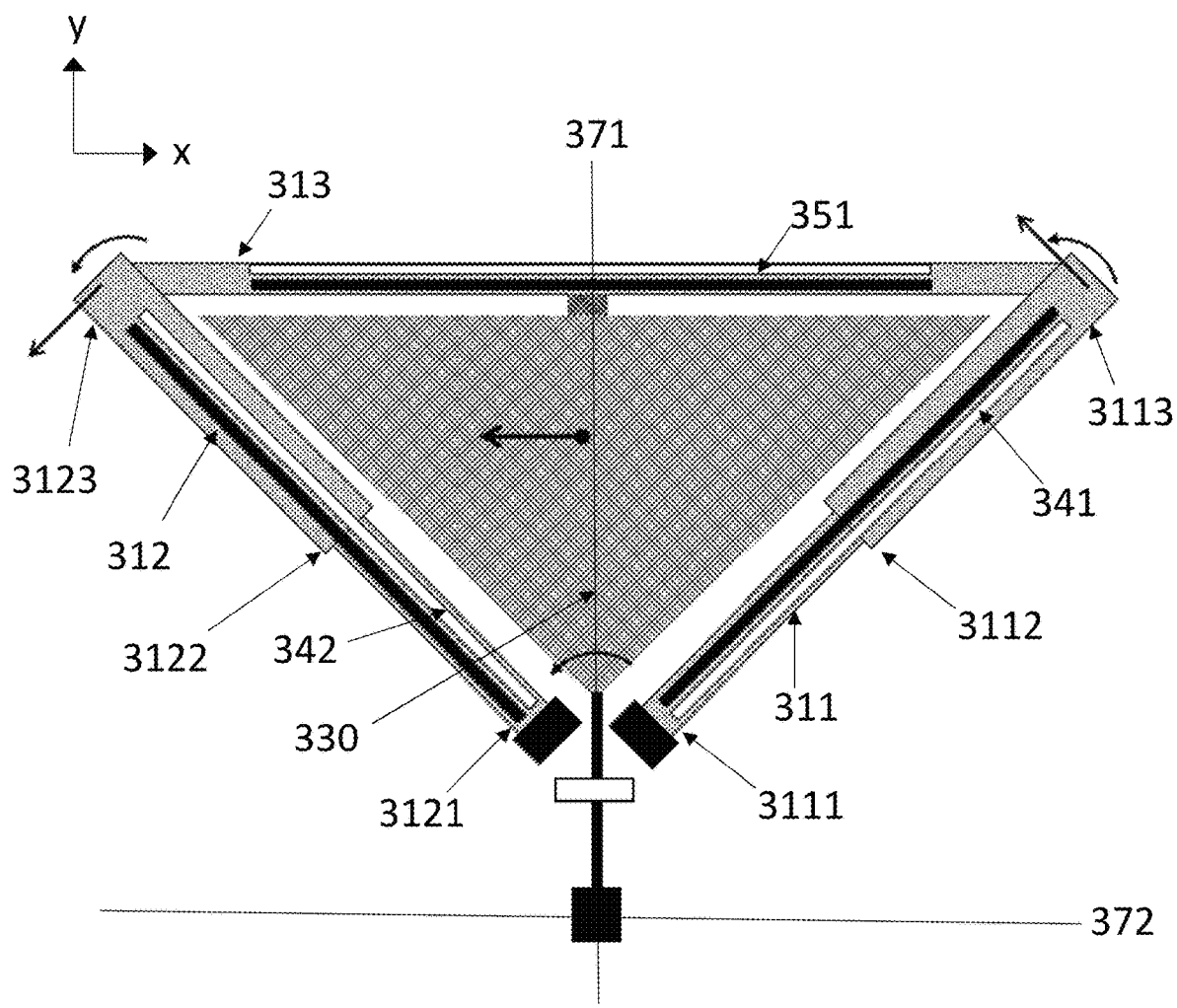
FIG. 3 illustrates another gyroscope with one proof mass suspended from a peripheral suspender.

FIG. 3 illustrates an embodiment where the deformation of the base of the peripheral suspender is alleviated in the illustrated triangular geometry. Reference numbers 313, 330, 341, 342, 351, 371 and 372 correspond to reference numbers 213, 230, 241, 242, 251, 271 and 272, respectively, in FIGS. 2a-2c.

In FIG. 3, the width of the first and second leg 311 and 312 in the peripheral suspender increases from the first end of the leg, which is located at the corresponding anchor point, to the second end of the leg, which is located at the corresponding corner point of the peripheral suspender.

In FIG. 3a, the first and second legs 311 and 312 have a narrow section which extends from the first end (3111, 3121) of the leg to an intermediate point (3112, 3122) on the leg, wherein the first end (3111) is attached to an anchor point, and a wide section which extends from the intermediate point (3112, 3122) on the leg to the second end (3113, 3123) of the leg, wherein the second end (3113, 3123) of the leg is attached to the base 313 of the peripheral suspender. Alternatively, the width of the first and second legs 311 and 312 may also increase gradually from the first end (3111, 3112) to the second end (3113, 3123). This option has not been illustrated. The gradual increase may be monotonous.

When the width of each leg increases towards the corresponding corner point of the peripheral suspender, the leg becomes less flexible for in-plane bending near the corner point than near the anchor point. This shifts the effective rotation center in the bending leg closer to the anchor point than in FIG. 2c. The magnitude of this shift will depend on the how much the width is increased.

This second embodiment can be combined with any other embodiment presented in this disclosure. In gyroscopes with multiple proof masses, the first and second legs on each peripheral suspender may have narrow section and a wide section.

Third Embodiment

Even though the effective center of rotation can be shifted with the change in geometry illustrated in FIG. 3, there will often be very limited room for widening the legs of the peripheral suspender, especially in applications where multiple proof mass pairs are used and peripheral suspenders are arranged in close proximity to each other, as illustrated in the embodiments presented below. Also, the effectiveness of transducers 341 and 342 for generating the movement will be decreased by increasing the width and/or length of the wide portions of the legs, since transducers are most effective in narrow portions of the leg, where flexibility is high.

Figure 4:
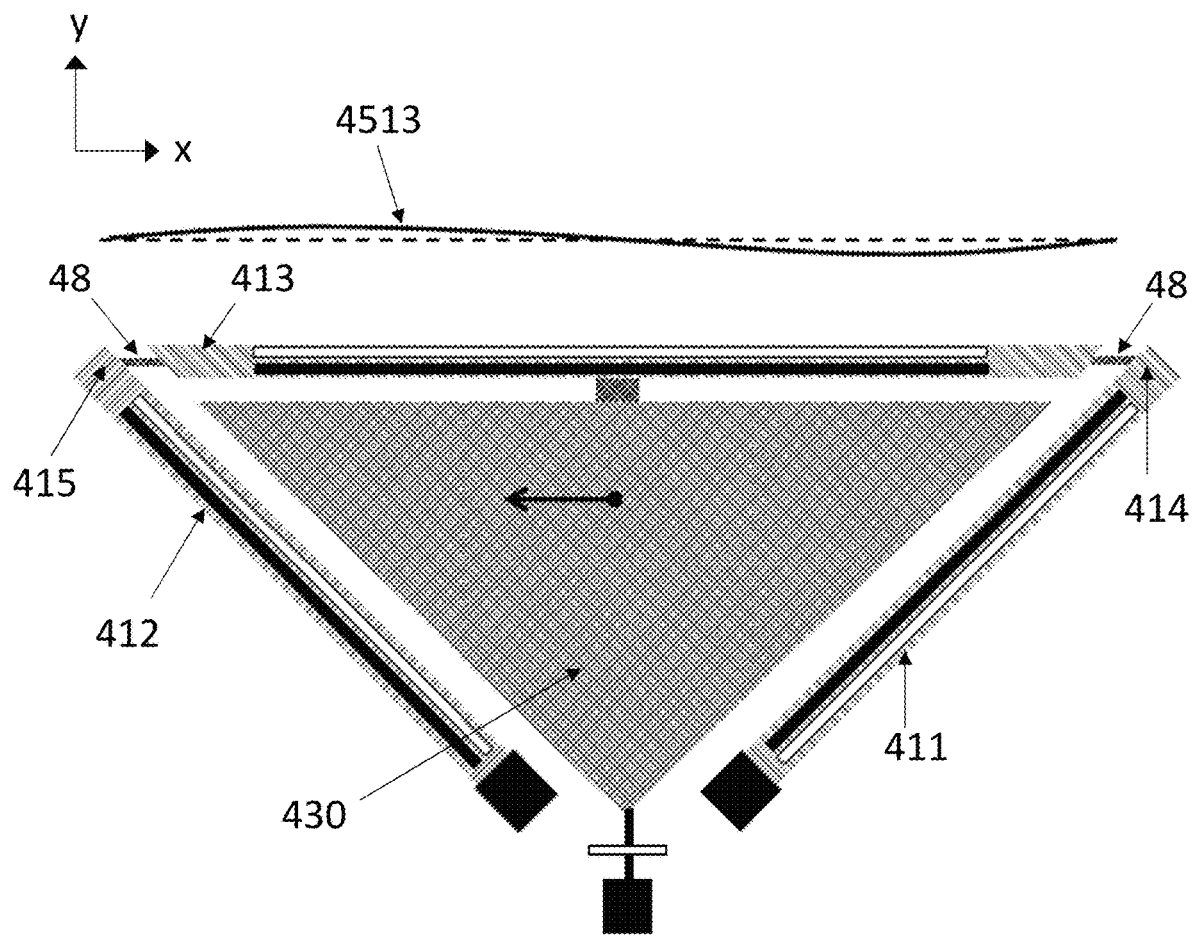
FIG. 4 illustrates another gyroscope with one proof mass suspended from a peripheral suspender.

FIG. 4 illustrates an alternative embodiment for alleviating the deformation of the base of the peripheral suspender in the illustrated triangular geometry. Reference numbers 411-415 and 430 correspond to reference numbers 211-215 and 230, respectively, in FIGS. 2a-2c.

In FIG. 4, each first and second corner point 414 and 415 on the peripheral suspender comprises a flexure 48, which joins the base 413 of the peripheral suspender to one of its legs 411/412, wherein the flexure 48 is narrower than the base 413 in the direction defined by the height of the truncated isosceles triangle formed by the peripheral suspender.

In FIG. 4, the direction defined by the height of the isosceles triangle is the y-direction, which is parallel to the first axis. In embodiments where the gyroscope includes multiple proof masses, some of the isosceles triangles defined by the peripheral suspenders will be oriented orthogonally to the one illustrated in FIG. 4, so that the direction defined by the height of the isosceles triangle is the x-direction, which is parallel to the second axis.

The flexures should be so long that their flexibility in the device plane reduces the deformation of the base 413. However, only the angle between the base 413 and the first and second legs 411 and 412 should due to the flexure. The distances between these three parts of the peripheral suspender should preferably not change during the primary oscillation movement, so that all of the bending in the first and second legs can transferred into linear primary oscillation in the proof mass 430. The flexures should also be thick in the direction perpendicular to the device plane, so that the support against out-of-plane movement provided by the peripheral suspender is not reduced.

The reduction which the flexures achieve in the deformation of the base 413 of the peripheral suspender due to primary oscillation is illustrated by the curve 4513 in FIG. 4.

This third embodiment can be combined with any other embodiment presented in this disclosure. In gyroscopes with multiple proof masses, each peripheral suspender may comprise flexures at each of its corner points.

Fourth Embodiment

In addition to the piezoelectric drive and sense transducers discussed above, it is sometimes advantageous to include auxiliary piezoelectric transducers in the gyroscope. Such transducers may for example be used to ensure that the drive oscillation amplitude remains constant, force feedback cancellation of the coupled sense oscillation or cancellation of any undesired coupling between the drive and sense oscillation modes.

Figure 5:
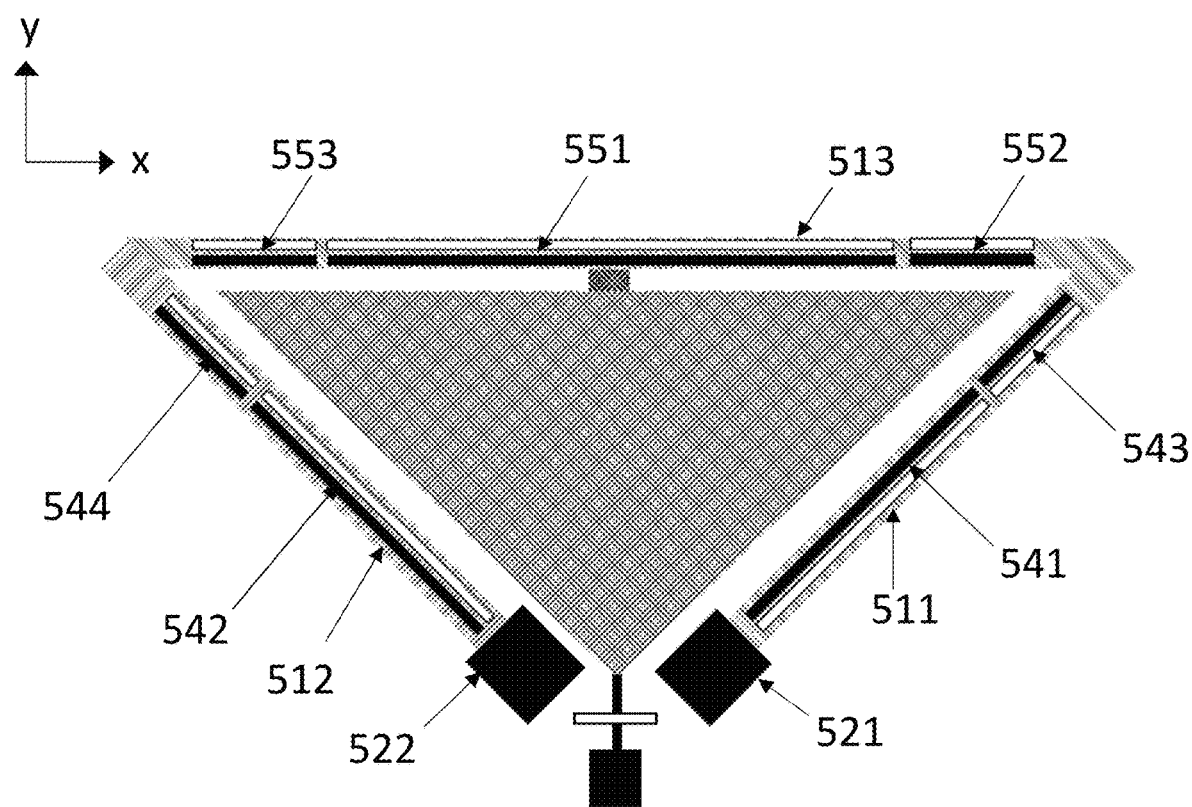
FIG. 5 illustrates another gyroscope with one proof mass suspended from a peripheral suspender.

FIG. 5 illustrates and embodiment where the first and second legs (411 and 412) of the peripheral suspender also comprises an auxiliary piezoelectric sense transducer (543 and 544) for detecting the amplitude of the primary oscillation, and the base 513 of each peripheral suspender also comprises one or more auxiliary piezoelectric transducers (552 and 553) for force feedback operation, force feedback damping and/or for cancelling drive oscillation motion which is coupled to the sense oscillation mode.

In other words, in addition to the piezoelectric drive transducers 541 and 542, the first and second legs of the peripheral suspender comprise an auxiliary piezoelectric sense transducer 543/544. The gyroscope control unit may be configured to read a drive amplitude monitoring voltage signal from an auxiliary piezoelectric sense transducer as the corresponding leg bends in drive oscillation movement. If the amplitude of this signal deviates from a predetermined value, the control unit may for example adjust the voltage signal which is fed to the drive transducers 541 and 542, until the drive amplitude again reaches its intended value. Alternatively, the control unit may report an error signal if the deviation exceeds a certain margin of error.

It is advantageous to place the primary piezoelectric drive transducers 541 and 542 closer to the first ends of the first and second legs of the peripheral suspender, so that they lie close to the corresponding anchor points 521 and 522, because the bending efficiency of the drive transducers is highest at this end of the leg. The auxiliary transducers 543/544 may be placed closer to the corner points on the peripheral suspender.

The control unit is configured to read a sense voltage signal from piezoelectric sense transducer 551, which bends due to the secondary oscillation mode induced by the Coriolis effect. In addition to this transducer, the base 513 of the peripheral suspender also comprises auxiliary piezoelectric transducers 552 and 553. These auxiliary transducers may be used for active interventions into the secondary oscillation mode. For example, when the gyroscope is used in closed-loop servo mode, or when the secondary mode resonance is damped by closed loop feedback, or when an applied electromechanical force is used to cancel a quadrature signal, at least one auxiliary piezoelectric transducer 552 or 553 may be driven with an alternating voltage so that it actively cancels the coupling of the primary oscillation into the secondary oscillation. The lengths of the auxiliary transducers 552/553 may differ from the length of the sense transducer 551.

It is advantageous to place the sense transducer 551 close to the center of the base of the peripheral suspender, and as symmetrically with respect the first axis as possible. The auxiliary transducers 552 and 553 on the base of the peripheral suspender may be located closer to the corner points of the peripheral suspender.

This fourth embodiment can be combined with any other embodiment presented in this disclosure. In gyroscopes with multiple proof masses, each peripheral suspender may comprise auxiliary transducers.

Fifth Embodiment

The gyroscope can be made more robust by implementing multiple masses which are driven into anti-phase oscillation, where proof masses move in opposite directions. Anti-phase oscillation combined with differential sense signal readout facilitates automatic cancellation of many error signals induced by external vibrations. The simultaneous movement of two masses in the same direction does not affect a differential measurement which is configured to measure their displacement in relation to each other.

The suspension and actuation arrangements described in this disclosure can be implemented with a proof mass system which comprises two proof masses. However, when the basic unit of the gyroscope is triangular, it is even more beneficial to implement a proof mass system with four proof masses. Only the latter alternative will therefore be discussed in detail in this disclosure.

Figure 6A:
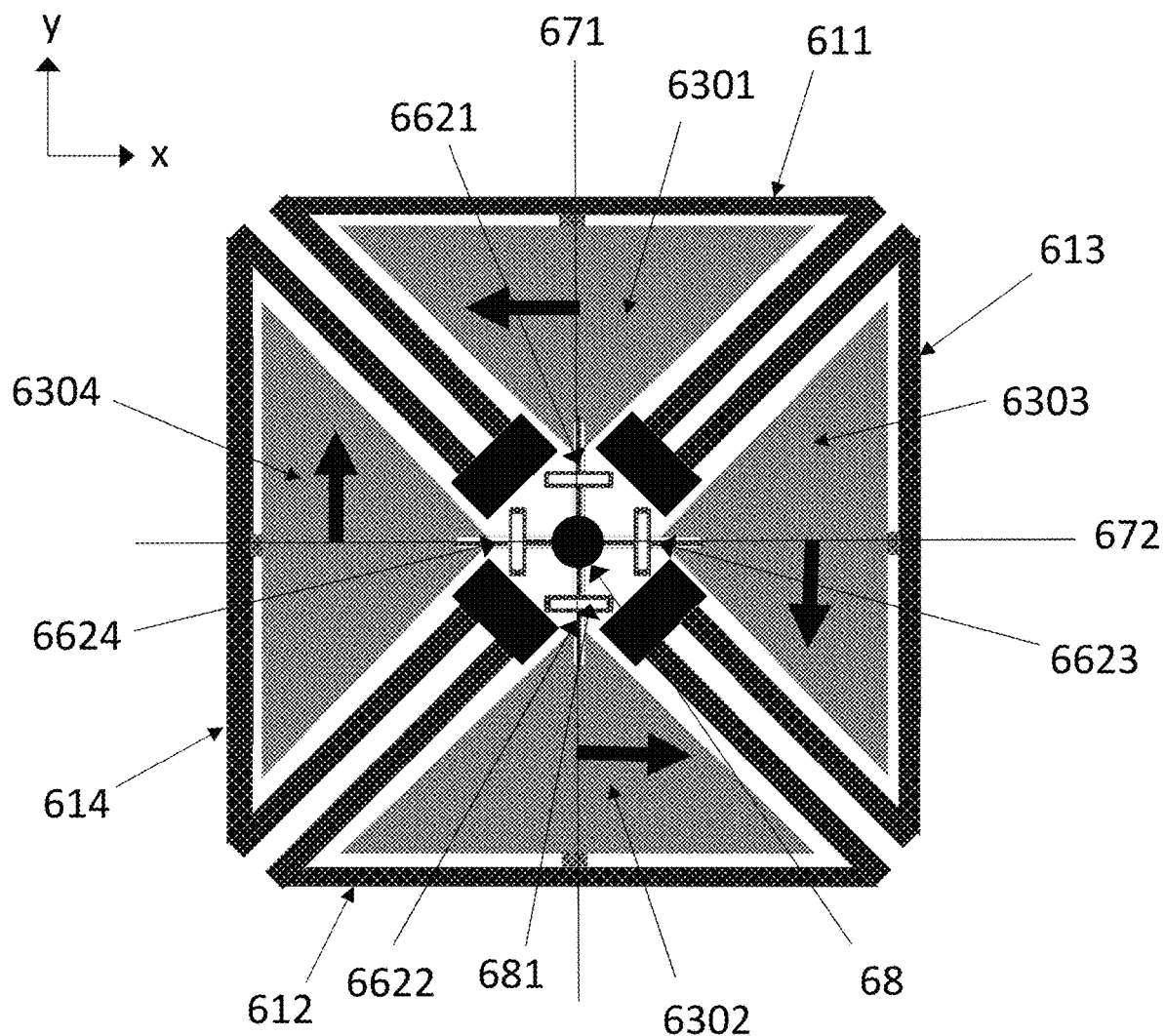
FIGS. 6a-6b illustrates a gyroscope with two proof mass pairs.

FIG. 6a illustrates a fifth embodiment of a microelectromechanical z-axis gyroscope, where the first proof mass is a part of a proof mass system which also comprises a second proof mass, so that the first proof mass and the second proof mass form a first proof mass pair, and the second proof mass is placed apart from the first proof mass and aligned on the first axis in its rest position.

The proof mass system also comprises third and fourth proof masses which form a second proof mass pair, wherein the third and fourth proof masses are placed apart from each other on a second axis, which is orthogonal to the first axis, and aligned on the second axis in their rest position, wherein the second proof mass pair is interconnected to the first proof mass pair at a crossing point where the first axis crosses the second axis.

The proof mass system in its rest position forms an essentially symmetrical mass distribution in relation to the first and the second axes, Each of the second, third and fourth proof masses are suspended from an additional peripheral suspender and an additional central suspender.

Each additional peripheral suspender extends from an additional first anchor point to an additional second anchor point, and the additional peripheral suspender has the shape of an isosceles triangle which partially surrounds the corresponding proof mass, and which is truncated at the additional first and additional second anchor points. A first leg of the additional peripheral suspender extends from the additional first anchor point past a first side of the corresponding proof mass to a first corner point on the additional peripheral suspender. A second leg of the additional peripheral suspender extends from the additional second anchor point past a second side of the corresponding proof mass to a second corner point on the additional peripheral suspender, and the base of the additional peripheral suspender, which joins together the first leg and the second leg, extends from the first corner point to the second corner point past a third side of the corresponding proof mass, and the base of the additional peripheral suspender is attached to the third side of the corresponding proof mass with a connector aligned on the same axis as the proof mass.

Each additional central suspender extends through the truncated corner of the isosceles triangle formed by the peripheral suspender, and the additional central suspender is attached to the corresponding proof mass, The second proof mass is driven into a primary oscillation mode by one or more piezoelectric drive transducers located on the first and/or second legs of the corresponding additional peripheral suspender, which simultaneously bend the first and second legs of the additional peripheral suspender in the same in-plane direction as the first and second legs of the first peripheral suspender are bent. The primary oscillation of the second proof mass occurs in-phase with the primary oscillation mode of the first proof mass around a vertical axis which passes through the crossing point.

One or more piezoelectric sense transducers located on the base of the corresponding additional peripheral suspender are configured to detect the secondary oscillation mode of the second proof mass, which bends the middle of the base in a direction substantially parallel to the first axis when the gyroscope undergoes angular rotation, whereby the sense oscillation of the second proof mass is converted into a sense signal by the one or more sense transducers.

Each proof mass in the second proof mass pair is driven into a primary oscillation mode by one or more piezoelectric drive transducers located on the first and/or second legs of the corresponding additional peripheral suspender, which simultaneously bend the first and second legs of the additional peripheral suspender in the opposite in-plane direction as the first and second legs of the first peripheral suspender are bent. The primary oscillation of the second proof mass pair occurs anti-phase with the primary oscillation mode of the first proof mass pair around a vertical axis which passes through the crossing point.

One or more piezoelectric sense transducers located on the base of the corresponding additional peripheral suspenders are configured to detect the secondary oscillation mode of said proof mass, which bends the middle of the base in a direction substantially parallel to the first axis when the gyroscope undergoes angular rotation, whereby the sense oscillation is converted into a sense signal by the one or more sense transducers In FIG. 6a, the gyroscope comprises a first proof mass 630 and a second proof mass 6301. These two masses form a first proof mass pair. The first proof mass 630 and second proof mass 6302 are both aligned on the first axis 671 in their rest positions. The gyroscope also comprises a third proof mass 6303 and a fourth proof mass 6304. These two masses form a second proof mass pair. The third proof mass 6303 and fourth proof mass 6304 are aligned on the second axis 672 in their rest position.

A central anchor point 68 is located at the crossing point between the two axes. The anchor point 68 provides suspension to each proof mass via the corresponding central suspender 6621, 6622, 6623 or 6624. The first central suspender is 6621, and the other central suspenders 6622, 6623 and 6624 may all be called additional suspenders. Alternatively, 6622 may be called the second central suspender, 6623 the third central suspender, and 6624 the fourth central suspender. Each central suspender may include a spring 681 connected to each central suspender.

Each proof mass 6301, 6302, 6303 and 6304 is partially surrounded by a peripheral suspender 611, 612, 613 and 614. The first peripheral suspender is 611, and the other peripheral suspenders 612, 613 and 614 may all be called additional peripheral suspenders. Alternatively, 612 may be called the second peripheral suspender, 613 the third peripheral suspender, and 614 the fourth peripheral suspender. The structure of each peripheral suspender and the location of piezoelectric transducers on top of it corresponds to that of the peripheral suspender described in the first embodiment above. The piezoelectric transducers have not been illustrated in FIG. 6a for reasons of clarity.

The peripheral suspenders 611-614 are separate structures. In other words, each peripheral suspender 611-614 is connected to two anchor points and to the corresponding proof mass, but no peripheral suspender is connected directly to another peripheral suspender.

The first proof mass pair 6301-6302 is driven to oscillate in-phase in relation to a vertical axis which passes through the crossing point, so that both proof masses 6301 and 6302 simultaneously move clockwise and counter-clockwise in relation to that axis. This in-phase oscillation is generated by applying suitably synchronized actuation voltages with suitable polarity to the piezoelectric transducers on each peripheral suspender in the first proof mass pair.

The sense oscillation of the first proof mass pair will occur in opposite directions substantially parallel to the first axis. When proof mass 6301 moves downward in FIG. 6a, proof mass 6302 moves upward, and vice versa.

The second proof mass pair 6303-6304 may be driven by the drive transducers on their peripheral suspenders into a similar primary oscillation mode, where both proof masses 6303 and 6304 simultaneously move clockwise and counter-clockwise in relation to a vertical axis which passes through the crossing point. The sense oscillation mode of this proof mass pair is substantially parallel to the second axis 672, so that proof mass 6303 moves leftward when proof mass 6304 moves rightward, and vice versa.

Furthermore, the primary oscillation mode of the second proof mass pair is anti-phase with the primary oscillation mode of the first proof mass pair in relation to a vertical axis which passes through the crossing point. For example, when proof masses 6301 and 6302 move clockwise, proof masses 6303 and 6304 simultaneously move counter-clockwise, and vice versa. This also makes the sense oscillation of the two proof mass pairs anti-phase in relation to the gyroscope center point, which lies at the crossing point of the first axis and the second axis, so that the first proof mass pair approaches the crossing point when the second proof mass pair moves away from the crossing point, and vice versa.

Figure 6B:
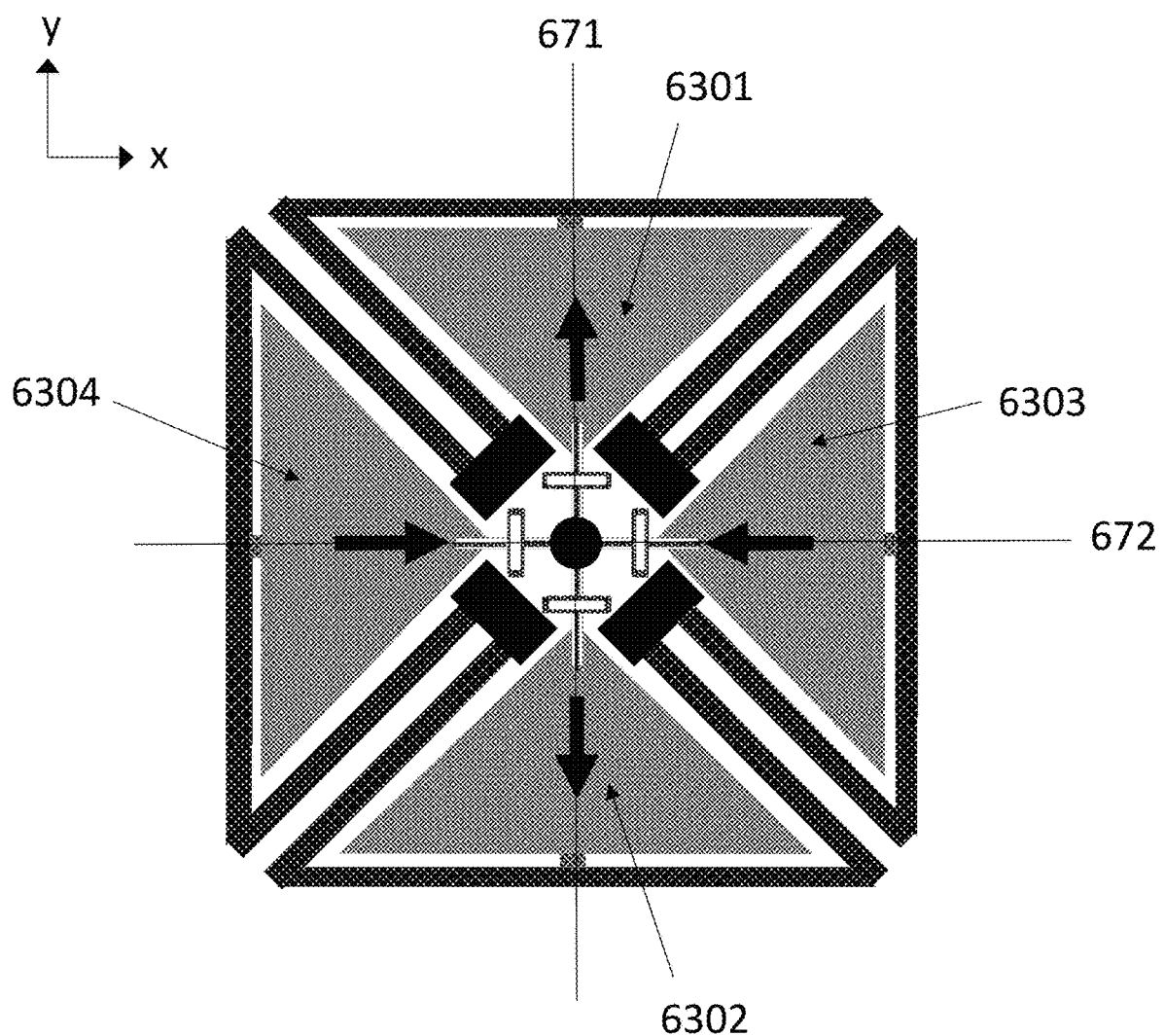

The anti-phase drive oscillation of the first and second proof mass in relation to a vertical axis which passes through the crossing point has been illustrated schematically (the rotational component has been excluded) with thick black arrows in FIG. 6a. The corresponding anti-phase sense oscillation in relation to the gyroscope center point has been schematically illustrated with thick black arrows in FIG. 6b.

The sense signals obtained from different piezoelectric sense transducers may be combined into one sense signal for example in a differential measurement arrangement, where certain erroneous signal components are automatically cancelled.

Figure 7:
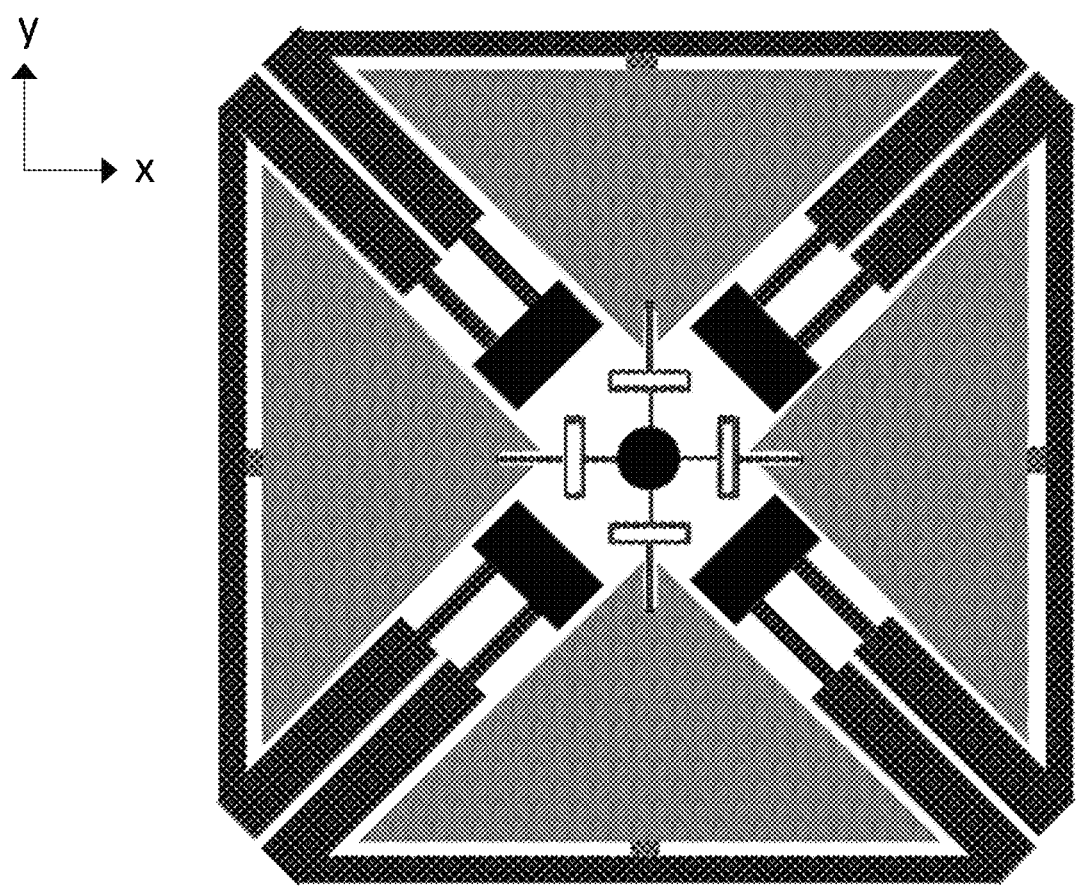
FIG. 7 illustrates a gyroscope with two proof mass pairs.
Figure 8A:
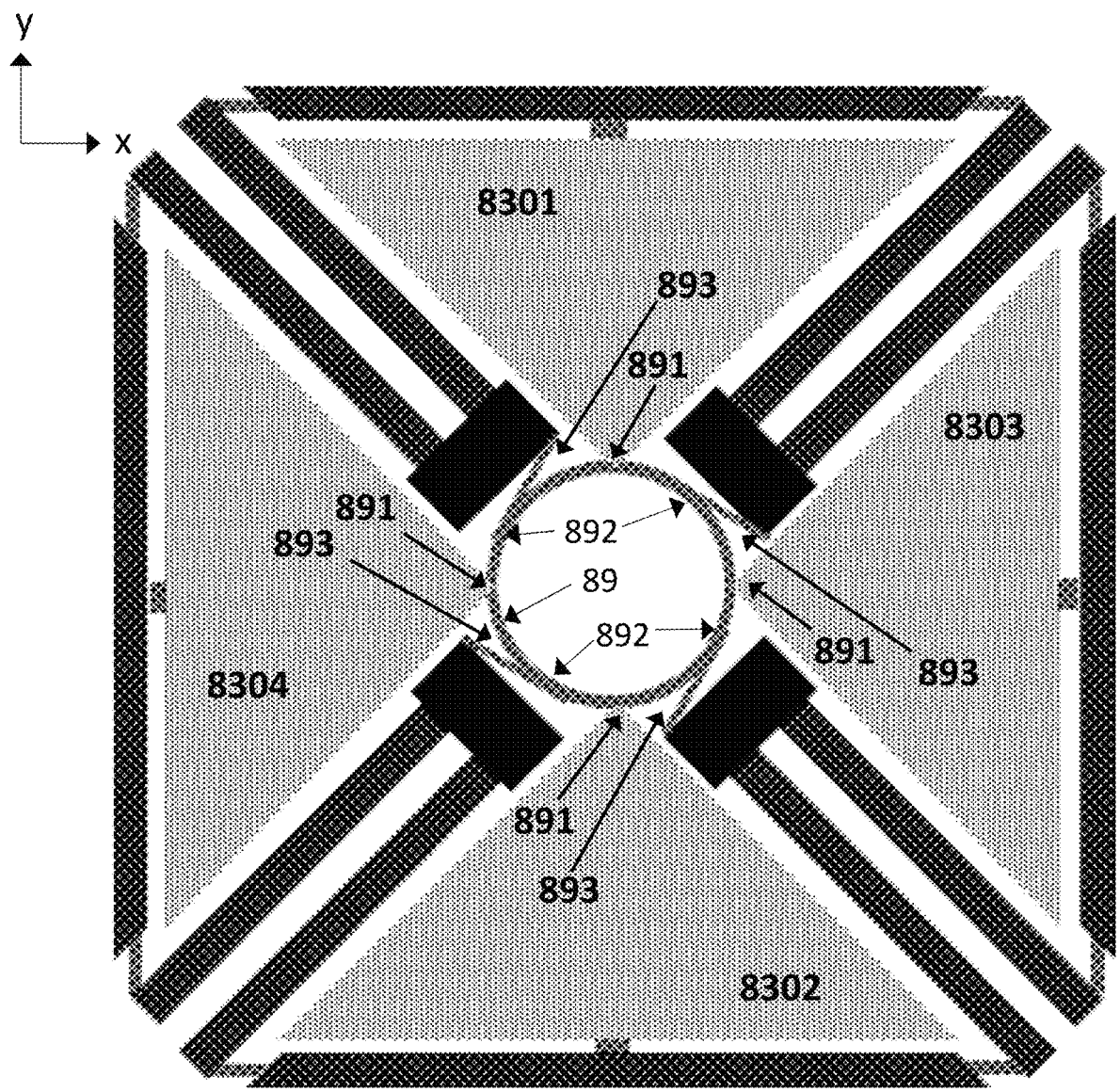
FIGS. 8a-8c illustrate a gyroscope with a central synchronization structure.
Figure 8B:
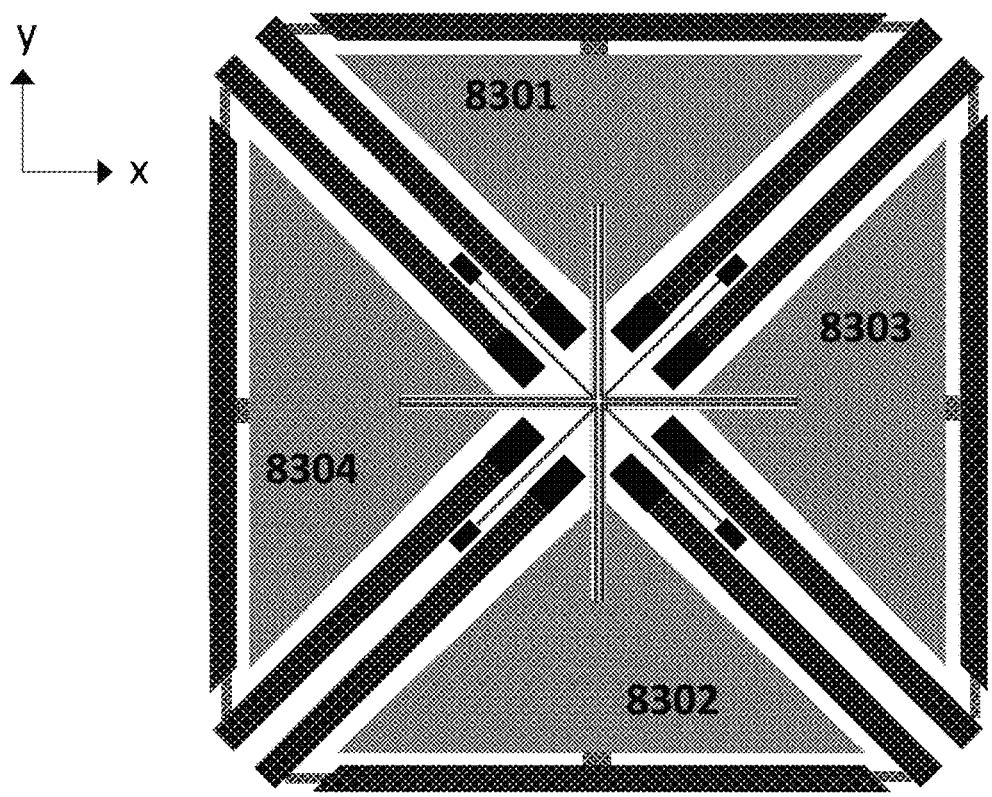

As mentioned above, the second, third and fourth embodiments may be combined with this fifth embodiment. FIG. 7 illustrates a gyroscope with two proof mass pairs where the width of the first and second leg and in each peripheral suspender increases from the first end of the leg, which is located at the corresponding anchor point, to the second end of the leg, which is located at the corresponding corner point of the peripheral suspender. FIGS. 8a and 8b illustrate gyroscopes with two mass pairs where each first and second corner point and on each peripheral suspender comprises a flexure which joins the base of that peripheral suspender to one of its legs.

Additionally, FIG. 8a illustrates an alternative design where a central synchronization element is utilized instead of a central anchoring point. In this figure, the oscillation of the first proof mass pair 8301+8302 and second proof mass pair 8303+8304 is synchronized by a substantially circular synchronization element 89 which is centred at the gyroscope center point and comprises four first attachment points 891. Each first attachment point 891 is located at a point where the substantially circular synchronization element crosses the first or the second axis, and each proof mass is attached to the nearest first attachment point 891 on the substantially circular synchronization element 89. The substantially circular synchronization element 89 also comprises two or more second attachment points 892, and a substantially linear suspender extends tangentially from each second attachment 892 point to one of the first or second anchor points in the gyroscope.

The term "linear suspender" refers to a structure which has a high aspect ratio (for example a length-to-width ratio) in the xy-plane. In other words, the length of a linear suspender in a first direction is much larger than its width in a second direction, perpendicular to the first. Its height in the vertical direction is typically the same as the height of other elements in the MEMS gyroscope, so its length-to-height aspect ratio may not be anywhere near as large as the length-to-width ratio. Such a linear suspender will bend very flexibly in the second direction but resist movement greatly in the first direction (lengthwise), and also in the vertical direction (depending on the height to width aspect ratio).

FIG. 8b illustrates another design with a central synchronization element. In this figure, the oscillation of the first proof mass pair 8301+8302 and second proof mass pair 8303+8304 is synchronized by four sets of synchronization springs centred at the gyroscope center point. The four sets of synchronization springs are illustrated in more detail in FIG. 8c. Each set is attached to a diagonal anchor point 821-824 and to two proof masses.

Each set comprises a diagonal synchronization spring 831-834 which extends from the diagonal anchor point 821-824 towards the gyroscope center point, a longitudinal synchronization spring 851-854 which is parallel to the first axis and extends from one proof mass in the first proof mass pair to the free end of the diagonal synchronization spring 831-834, and a transversal synchronization spring 841-844 which is parallel to the second axis and extends from an adjacent proof mass in the second proof mass pair to the free end of the same diagonal synchronization spring 831-834.

Figure 8C:
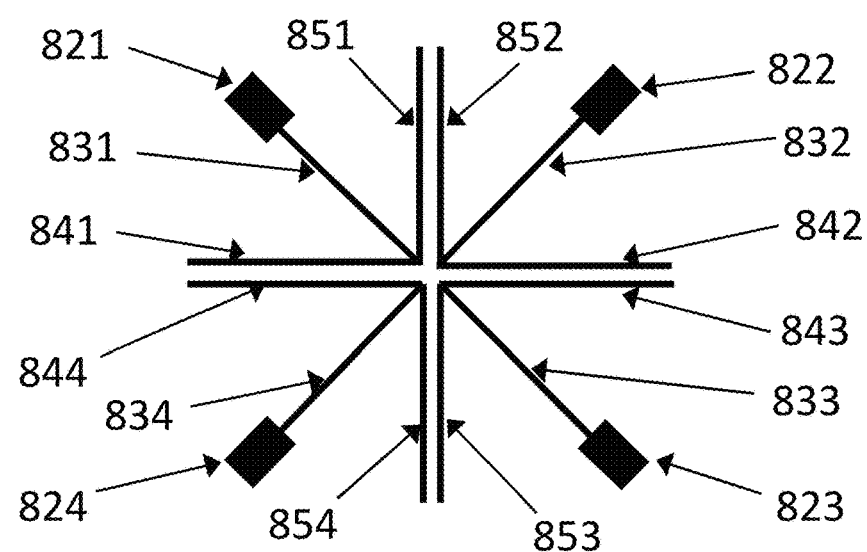

The four sets of synchronization springs may be organized around the gyroscope center point in the manner illustrated in FIGS. 8b and 8c. Since the synchronization springs can be quite narrow, the anchor points for the peripheral suspender can be placed quite close to the gyroscope center point and the legs of the peripheral suspender can consequently be quite long.

Additional Embodiments

Figure 9:
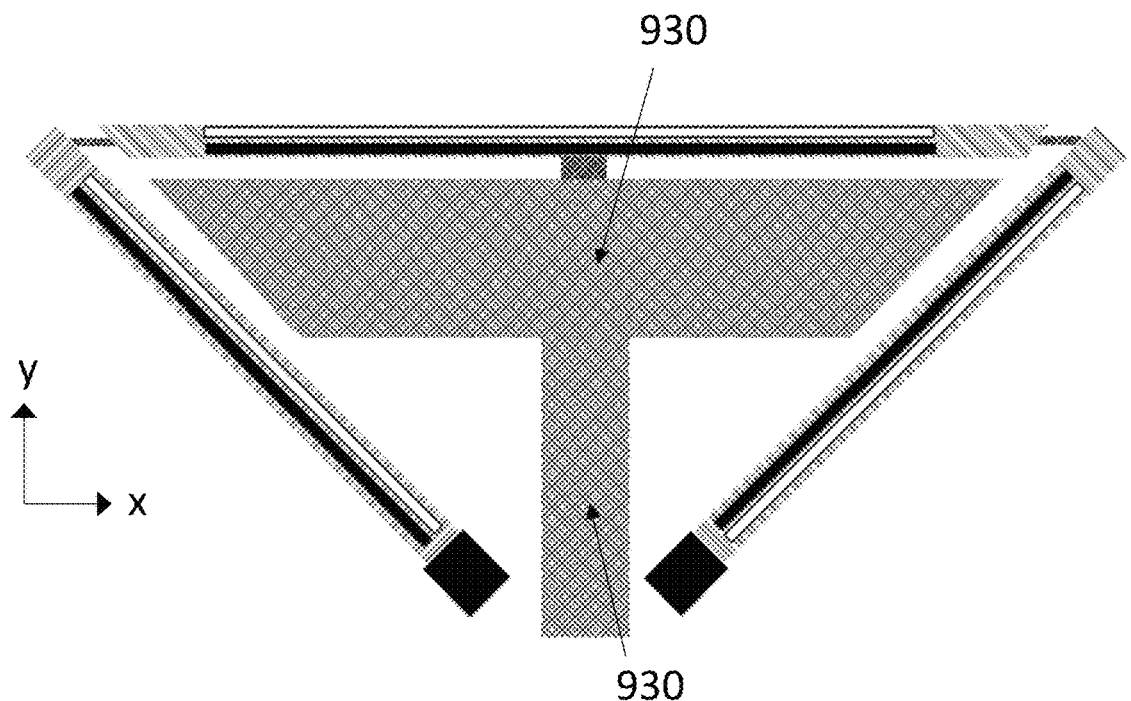
FIGS. 9 and 10 illustrate two alternative shapes for the proof mass.
Figure 10:
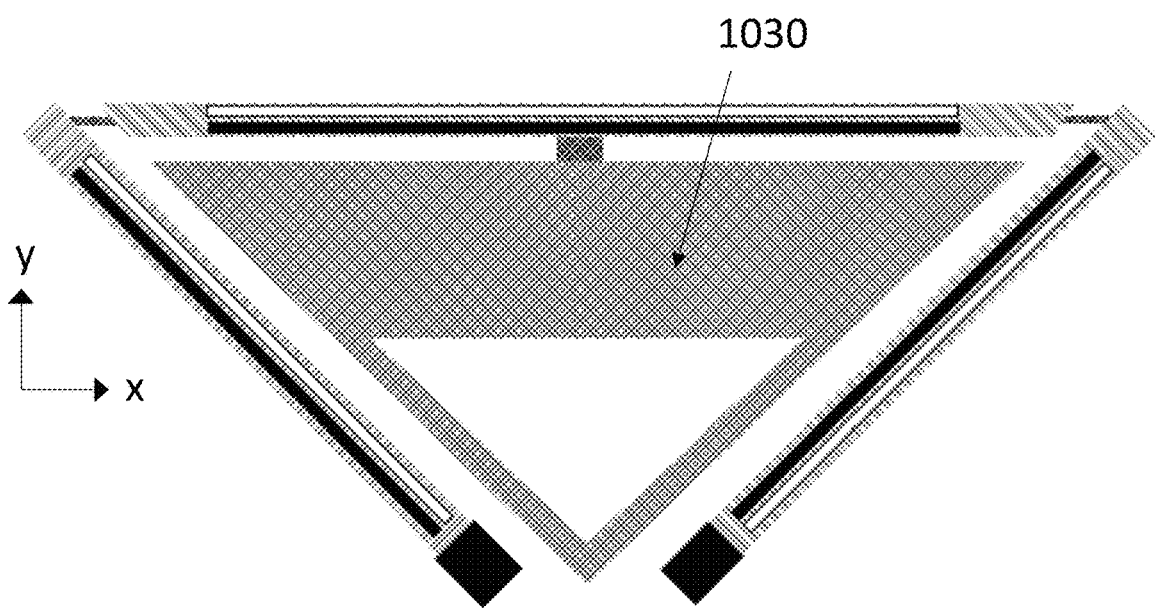

FIGS. 9 and 10 illustrate two alternative shapes for the proof mass. In FIG. 9, the proof mass 930 has a hammer-like shape. In FIG. 10, the proof mass 1030 is shaped like a right-angled isosceles triangle with a triangular hollow area. The vacant space provided near masses with these shapes may be utilized for various additional purposes, for example to provide passages for electrical wiring. Many other shapes are also possible, but it is in general advantageous to concentrate as much mass as possible near the base of the peripheral suspender.

In the gyroscopes illustrated in FIGS. 6a-8b, adjacent peripheral suspenders are always coupled to proof masses from different proof mass pairs. For example, in FIG. 6a peripheral suspenders 611 is coupled to proof mass 6301 from the first proof mass pair, while the peripheral suspenders 613 and 614 which lie adjacent to 611 are coupled to proof masses 6303 and 6304 from the second proof mass pair.

The peripheral suspender of each proof mass in the first proof mass pair may share its first anchor point with the peripheral suspender of one proof mass in the second proof mass pair, and may share its second anchor point with the peripheral suspender of the other proof mass in the second proof mass pair, and the peripheral suspender of each proof mass in the second proof mass pair may share its first anchor point with the peripheral suspender of one proof mass in the first proof mass pair, and may share its second anchor point with the peripheral suspender of the other proof mass in the first proof mass pair.

Figure 11A:
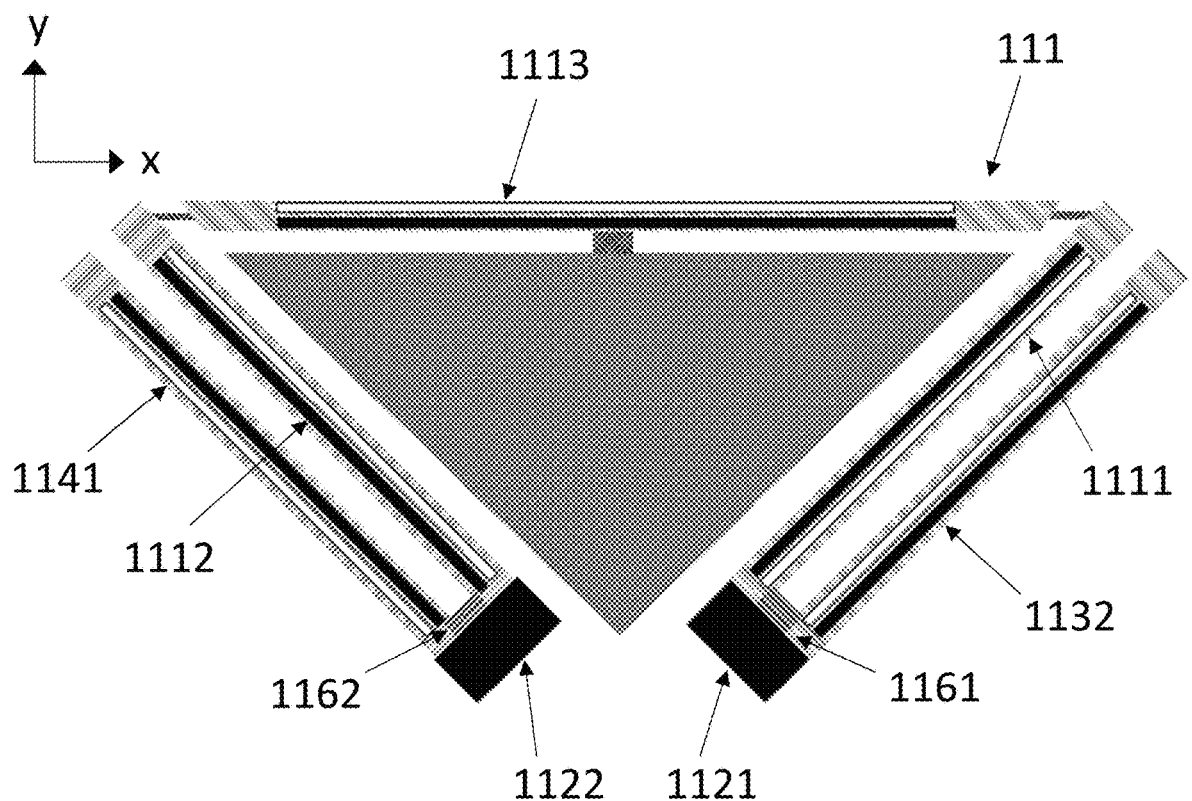
FIGS. 11a-11c illustrate the anchoring of a peripheral suspender.

FIG. 11a illustrates this arrangement for peripheral suspender 111. Its first leg 1111 is attached to first anchor point 1121, which is the same anchor point where the second leg 1132 of the adjacent peripheral suspender on the right is attached. The second leg 1112 of the peripheral suspender 111 is attached to second anchor point 1122, where the first leg of the adjacent peripheral suspender on the left is also attached.

Figure 11B:
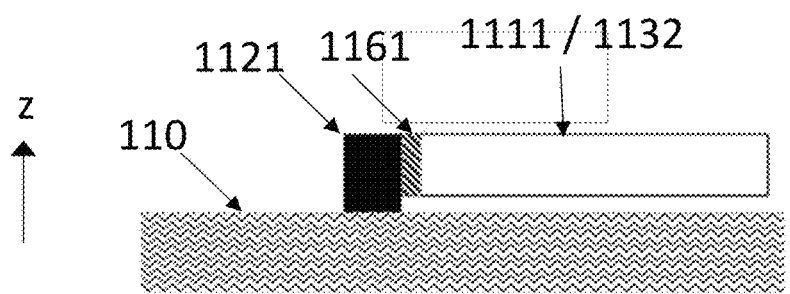

The first and second legs of adjacent suspenders may be joined together by an intermediate body 1161/1162. FIG. 11b illustrates a vertical cross-section of the anchor point 1121, the intermediate body 1161 and the legs 1111 and 1132 in a configuration where the suspenders such as 1111 and 1132 are located above the surface of an underlying substrate 110, and the anchor points such as 1121 extend down to the substrate. As illustrated in FIG. 11b, intermediate body 1161 does not extend down to the substrate. The deformation which takes place in the intermediate body 1161 when the suspenders 1111 and 1132 are bent by their respective drive transducers will couple and synchronize the anti-phase oscillations of the first and second proof mass pairs to a single resonance mode.

Intermediate body 1161, which joins together the suspenders 1111 and 1132, may alternatively be placed closer to the middle of the suspenders, so that it resembles a free-standing bridge between the two suspenders. This arrangement may increase strengthen the synchronizing effect of the intermediate body. The intermediate body should not be placed so far away from the anchor point 1121 that it hinders the bending of the suspenders.

The first and second legs of adjacent suspenders may alternatively be connected directly at the anchor point 1121 without any intermediate body, as in FIGS. 6a-8b above. A smaller synchronization effect may be obtained even then, through local deformation of the anchor point.

Figure 11C:
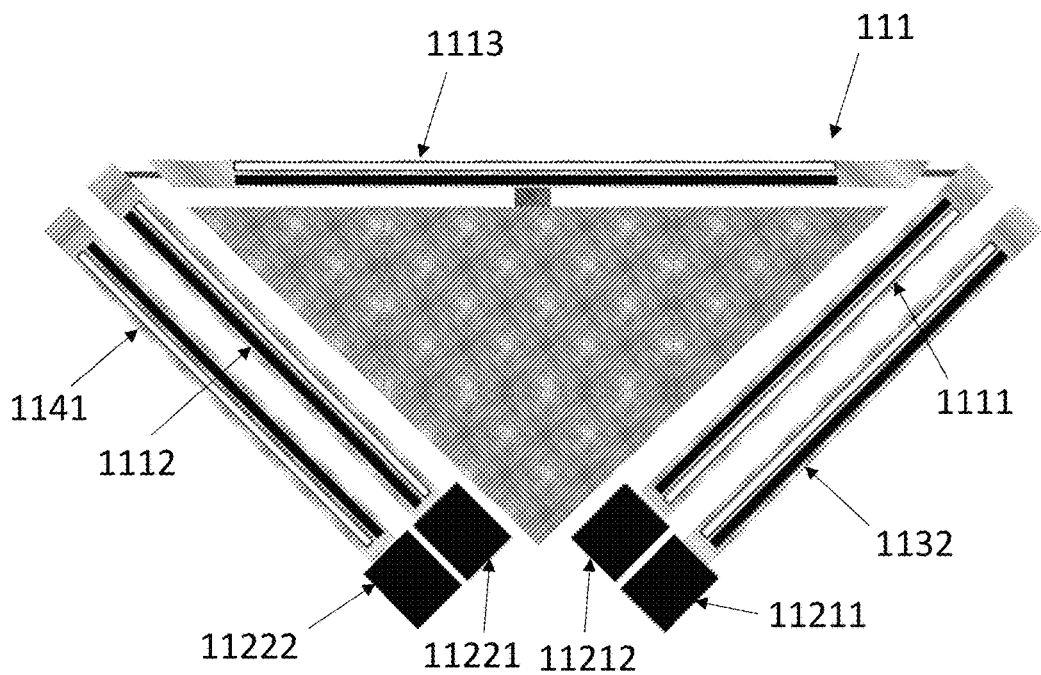

FIG. 11c illustrates an alternative embodiment where the anchor points of adjacent peripheral suspenders are completely separated from each other, so that direct coupling and synchronization of bending motion between adjacent legs 1111/1132 and 1112/1141 is reduced. This arrangement was also employed in FIG. 8b.

Figure 11D:
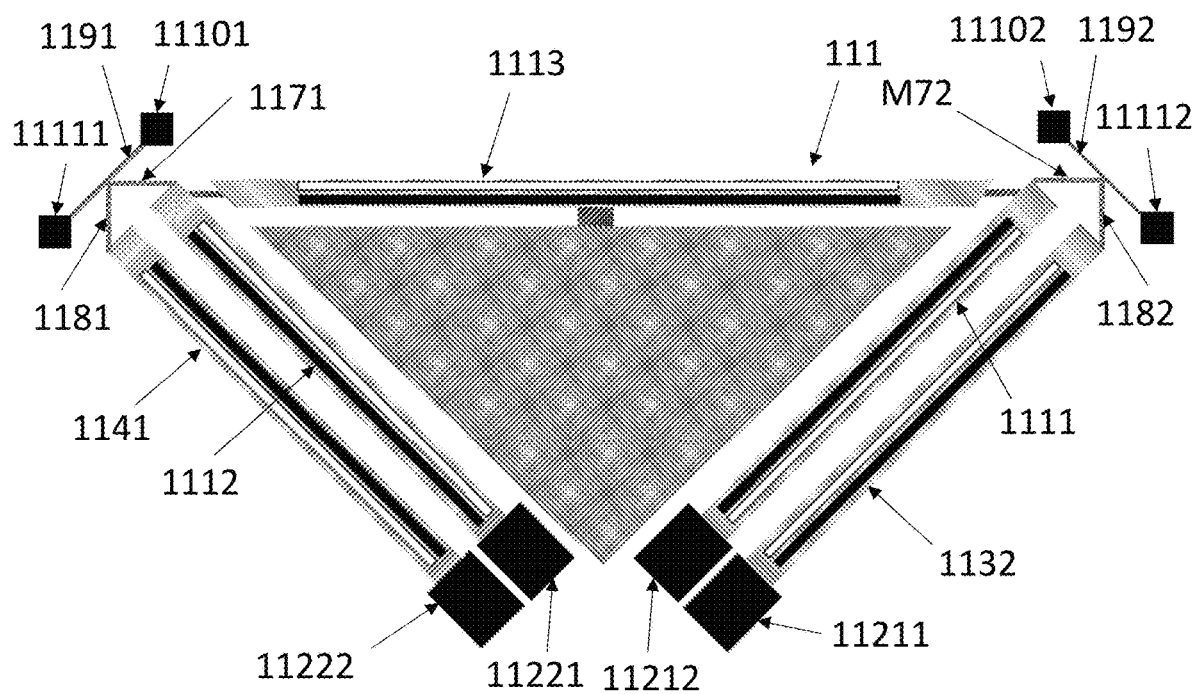
FIGS. 11d-11e illustrate a gyroscope with a peripheral synchronization structure.
Figure 11E:
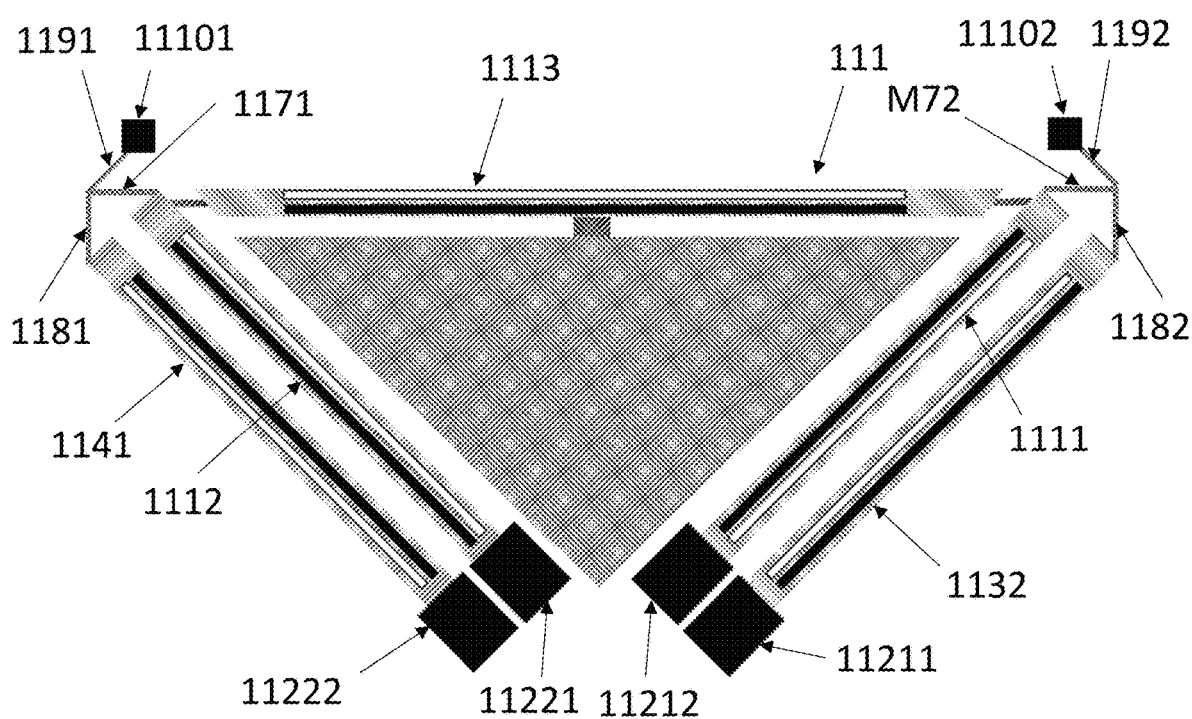

The desired synchronization of proof mass oscillations can also be promoted by interconnecting peripheral suspenders at their corner points, as illustrated in FIGS. 11d and 11e. This peripheral synchronization can be implemented either in combination with central synchronization elements such as the ones illustrated in FIGS. 8a-8c, or without any complementary synchronization. In FIGS. 11d and 11e a corner spring (1171-1172, 1181-1182) extends outward from each corner point on each peripheral suspender in a direction defined by the base of said peripheral suspender, so that a first end of each corner spring (1171-1172, 1181-1182) is attached to a peripheral suspender, and a second end of each corner spring (1171-1172, 1181-1182) is attached to a diagonal support spring (1191, 1192) which is attached to at least one anchor point (11101, 11111, 11102, 11112) and is oriented at an angle of substantially 45° in relation to the first axis and the second axis.

In this case, the desired coupling and synchronization of the oscillations of the first and second proof mass pairs is promoted as follows. In the anti-phase drive oscillation illustrated in FIG. 6a, the corner springs (1171-1172, 1181-1182) will pull and push the diagonal support springs 1191 and 1192 towards and away from the gyroscope center point when adjacent proof masses rotate towards and away from each other. Cophasal motion where adjacent proof masses simultaneously rotate in the same direction (a vibration mode which could be induced by external vibrations) will be resisted by the diagonal support springs 1191 and 1192 because these springs cannot undergo translation in the direction of the anchor points to which they are attached. The diagonal support springs 1191 and 1192 should be sufficiently narrow and flexible to facilitate the desired bending.

In other words, adjacent peripheral suspenders are in FIGS. 11e-11d connected to each other with corner springs and an anchored diagonal spring so that it is easier for the corresponding adjacent proof mass to rotate in opposite directions than it is for them to rotate in the same direction. The corner springs and diagonal springs are significantly narrower than the legs and the base of the peripheral suspender. The peripheral synchronization can promote the desired drive oscillation and inhibit in-phase oscillation of the two proof mass pairs, which is desirable for obtaining good robustness to external vibration. Additionally, the peripheral synchronization will prevent out-of-plane movement of the ends of the legs such as 1111, 1112 and bases such as 1113, which will further improve the robustness to external vibrations.

The invention claimed is:

1. A microelectromechanical z-axis gyroscope which comprises a first proof mass aligned on a first axis in a rest position of the first proof mass,
wherein the first proof mass is suspended from a first peripheral suspender and a first central suspender, wherein
the first peripheral suspender extends from a first anchor point to a second anchor point, and the first peripheral suspender has the shape of an isosceles triangle which partially surrounds the first proof mass, wherein the isosceles triangle is truncated at the first and second anchor points, and a first leg of the first peripheral suspender extends from the first anchor point past a first side of the first proof mass to a first corner point on the first peripheral suspender, and a second leg of the first peripheral suspender extends from the second anchor point past a second side of the first proof mass to a second corner point on the first peripheral suspender, and a base of the first peripheral suspender, which joins together the first leg and the second leg, extends from the first corner point to the second corner point past a third side of the first proof mass, and the base of the first peripheral suspender is attached to the third side of the first proof mass with a connector aligned on the first axis,
the first central suspender extends through a truncated corner of the isosceles triangle formed by the first peripheral suspender, and is attached to the first proof mass,
wherein the first proof mass is driven into a primary oscillation mode by one or more piezoelectric drive transducers located on the first and/or second legs of the first peripheral suspender, which simultaneously bend the first and second legs of the first peripheral suspender in the same in-plane direction,
and wherein one or more piezoelectric sense transducers located on the base of the first peripheral suspender are configured to detect a secondary oscillation mode of the first proof mass, which bends a middle of the base in a direction substantially parallel to the first axis when the gyroscope undergoes angular rotation, whereby a sense oscillation is converted into a sense signal by the one or more sense transducers,
and wherein
the first proof mass is a part of a proof mass system which also comprises a second proof mass, so that the first proof mass and the second proof mass form a first proof mass pair, and the second proof mass is placed apart from the first proof mass and aligned on the first axis in a rest position of the second proof mass,
wherein the proof mass system also comprises third and fourth proof masses which form a second proof mass pair, wherein the third and fourth proof masses are placed apart from each other on a second axis, which is orthogonal to the first axis, and aligned on the second axis in a rest position of the third and fourth proof masses, wherein the second proof mass pair is interconnected to the first proof mass pair at a crossing point where the first axis crosses the second axis,
wherein the proof mass system in a rest position of the proof mass system forms an essentially symmetrical mass distribution in relation to the first and the second axes,
wherein each of the second, third and fourth proof masses are suspended from an additional peripheral suspender and an additional central suspender, wherein
each additional peripheral suspender extends from an additional first anchor point to an additional second anchor point, and the additional peripheral suspender has the shape of an isosceles triangle which partially surrounds the corresponding proof mass, and which is truncated at the additional first and additional second anchor points, and a first leg of the additional peripheral suspender extends from the additional first anchor point past a first side of the corresponding proof mass to a first corner point on the additional peripheral suspender, and a second leg of the additional peripheral suspender extends from the additional second anchor point past a second side of the corresponding proof mass to a second corner point on the additional peripheral suspender, and a base of the additional peripheral suspender, which joins together the first leg and the second leg, extends from the first corner point to the second corner point past a third side of the corresponding proof mass, and the base of the additional peripheral suspender is attached to the third side of the corresponding proof mass with a connector aligned on the same axis as the corresponding proof mass, and each additional central suspender extends through a truncated corner of an isosceles triangle formed by the additional peripheral suspender, and the additional central suspender is attached to the corresponding proof mass, wherein the second proof mass is driven into a primary oscillation mode by one or more piezoelectric drive transducers located on the first and/or second legs of the corresponding additional peripheral suspender, which simultaneously bend the first and second legs of the additional peripheral suspender in the same in-plane direction as the first and second legs of the first peripheral suspender are bent, so that a primary oscillation of the second proof mass occurs in-phase with the primary oscillation mode of the first proof mass around a vertical axis which passes through the crossing point, and wherein one or more piezoelectric sense transducers located on the base of the corresponding additional peripheral suspender are configured to detect a secondary oscillation mode of the second proof mass, which bends the middle of the base in a direction substantially parallel to the first axis when the gyroscope undergoes angular rotation, whereby a sense oscillation of the second proof mass is converted into a sense signal by the one or more sense transducers, and wherein each proof mass in the second proof mass pair is driven into a primary oscillation mode by one or more piezoelectric drive transducers located on the first and/or second legs of the corresponding additional peripheral suspender, which simultaneously bend the first and second legs of the additional peripheral suspender in the opposite in-plane direction as the first and second legs of the first peripheral suspender are bent, so that a primary oscillation of the second proof mass pair occurs anti-phase with the primary oscillation mode of the first proof mass pair around a vertical axis which passes through the crossing point, and wherein one or more piezoelectric sense transducers located on the base of the corresponding additional peripheral suspenders are configured to detect the secondary oscillation mode of the corresponding proof mass, which bends the middle of the base in a direction substantially parallel to the second axis when the gyroscope undergoes angular rotation, whereby a sense oscillation is converted into a sense signal by the one or more sense transducers, and the first central suspender and each additional central suspender rigidly resist movement in the direction of the vertical axis.

2. A microelectromechanical z-axis gyroscope according to claim 1, wherein a width of each first leg and a width of each second leg in each peripheral suspender increases from the first end of the corresponding leg, which is located at the corresponding anchor point, to the second end of the corresponding leg, which is located at the corresponding corner point of the corresponding peripheral suspender.

3. A microelectromechanical z-axis gyroscope according to claim 1, wherein each first and second corner point on each peripheral suspender comprises a flexure which joins the base of the peripheral suspender to one leg of the peripheral suspender, wherein the flexure is narrower than the base in the direction defined by a height of the truncated isosceles triangle formed by the peripheral suspender.

4. A microelectromechanical z-axis gyroscope according to claim 1, wherein the first and second legs of each peripheral suspender also comprises an auxiliary piezoelectric sense transducer for detecting an amplitude of the primary oscillation mode, and the base of each peripheral suspender also comprises one or more auxiliary piezoelectric transducers for force feedback operation, force feedback damping and/or for cancelling drive oscillation motion which is coupled to a sense oscillation mode.

5. A microelectromechanical z-axis gyroscope according to claim 1, wherein the peripheral suspender of each proof mass in the first proof mass pair shares the first anchor point with the peripheral suspender of one proof mass in the second proof mass pair, and shares the second anchor point with the peripheral suspender of the other proof mass in the second proof mass pair, and that the peripheral suspender of each proof mass in the second proof mass pair shares the first anchor point with the peripheral suspender of one proof mass in the first proof mass pair, and shares the second anchor point with the peripheral suspender of the other proof mass in the first proof mass pair.

6. A microelectromechanical z-axis gyroscope according to claim 1, wherein a corner spring extends outward from each corner point on each peripheral suspender in a direction defined by the base of said peripheral suspender, so that a first end of each corner spring is attached to a peripheral suspender, and a second end of each corner spring is attached to a diagonal support spring, which is attached to at least one anchor point and is oriented at an angle of substantially 45° in relation to the first axis and the second axis.

* * * * *